(12) United States Patent
Liang et al.

(10) Patent No.: US 11,302,276 B2
(45) Date of Patent: Apr. 12, 2022

(54) GATE DRIVE CIRCUIT, TOUCH DISPLAY DEVICE AND DRIVING METHOD

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xuebo Liang, Beijing (CN); Zhi Zhang, Beijing (CN); Xiuzhu Tang, Beijing (CN); Jingpeng Zhao, Beijing (CN); Shuai Chen, Beijing (CN); Xing Dong, Beijing (CN); Qian Qian, Beijing (CN); Taoliang Tang, Beijing (CN); Lijun Xiong, Beijing (CN); Zhenguo Tian, Beijing (CN); Shuang Hu, Beijing (CN); Jian Yang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 364 days.

(21) Appl. No.: 16/473,858

(22) PCT Filed: Oct. 18, 2018

(86) PCT No.: PCT/CN2018/110744
§ 371 (c)(1),
(2) Date: Jun. 26, 2019

(87) PCT Pub. No.: WO2019/161669
PCT Pub. Date: Aug. 29, 2019

(65) Prior Publication Data
US 2021/0335301 A1 Oct. 28, 2021

(30) Foreign Application Priority Data

Feb. 26, 2018 (CN) .......................... 201810159563.3

(51) Int. Cl.
*G09G 3/36* (2006.01)
*G06F 3/041* (2006.01)
*G11C 19/28* (2006.01)

(52) U.S. Cl.
CPC ......... *G09G 3/3674* (2013.01); *G06F 3/0412* (2013.01); *G06F 3/04166* (2019.05);
(Continued)

(58) Field of Classification Search
CPC . G11C 19/287; G06F 3/0412; G06F 3/04166; G09G 2300/0426;
(Continued)

(56) References Cited

U.S. PATENT DOCUMENTS

| 10,026,373 | B2 | 7/2018 | Chen |
| 2017/0115808 | A1* | 4/2017 | Cho ................... G06F 3/04166 |

(Continued)

FOREIGN PATENT DOCUMENTS

| CN | 101944322 A | 1/2011 |
| CN | 101950522 A | 1/2011 |

(Continued)

OTHER PUBLICATIONS

Extended European Search Report dated Jan. 27, 2002; Appln. No. 18889955.3.

*Primary Examiner* — Hong Zhou

(57) ABSTRACT

A gate drive circuit, a touch display device and a driving method are provided. The gate drive circuit includes a plurality of cascaded shift register units and a voltage stabilization circuit. Each of the plurality of cascaded shift register units includes a touch scanning control terminal; and
(Continued)

the voltage stabilization circuit is connected to a first shift register unit and at least one second shift register unit after the first shift register unit, of the plurality of cascaded shift register units, and configured to compensate a level of a first node of the group of second shift register units in response to the touch scanning control signal.

18 Claims, 10 Drawing Sheets

(52) U.S. Cl.
CPC ......... *G09G 3/3648* (2013.01); *G11C 19/287* (2013.01); *G09G 2300/0426* (2013.01); *G09G 2310/0286* (2013.01)

(58) Field of Classification Search
CPC ......... G09G 2310/0286; G09G 3/3648; G09G 3/3674; G09G 3/3677; G09G 3/3696
See application file for complete search history.

(56) References Cited

U.S. PATENT DOCUMENTS

| | | | |
|---|---|---|---|
| 2017/0124976 | A1 | 5/2017 | Chen |
| 2017/0178584 | A1* | 6/2017 | Ma ........................ G09G 3/3696 |
| 2017/0178749 | A1* | 6/2017 | Ma ........................ G11C 19/28 |
| 2017/0221441 | A1* | 8/2017 | Gu ........................ G09G 3/3677 |
| 2017/0235406 | A1* | 8/2017 | Su ........................ G06F 3/0412 |
| | | | 345/173 |
| 2018/0047356 | A1* | 2/2018 | Su ........................ G11C 19/287 |

FOREIGN PATENT DOCUMENTS

| | | | |
|---|---|---|---|
| CN | 104425033 | A | 3/2015 |
| CN | 1044821159 | A | 8/2015 |
| CN | 107731170 | A | 2/2018 |
| EP | 3232430 | A1 | 10/2017 |

* cited by examiner ions of Chinese Patent
GATE DRIVE CIRCUIT, TOUCH DISPLAY DEVICE AND DRIVING METHOD The present application claims priority of Chinese Patent Application No. 201810159563.3, filed on Feb. 26, 2018, the disclosure of which is incorporated herein by reference in its entirety as part of the present application.

TECHNICAL FIELD

Embodiments of the present disclosure relate to a gate drive circuit, a touch display device and a driving method.

BACKGROUND

In fields of display technologies, for example, a pixel array of a liquid crystal display panel generally includes a plurality of rows of gate lines and a plurality of columns of data lines crossed with the gate lines. The gate lines can be driven by a bonded integrated driving circuit. In recent years, with the continuous improvement of preparation processes of amorphous silicon thin film transistors or oxide thin film transistors, a gate line driving circuit can be directly integrated in a thin film transistor array substrate to form a GOA (Gate driver On Array) to drive the gate lines. For example, a GOA including a plurality of cascaded shift register units can be used to provide on/off state voltage signals for the plurality of rows of gate lines of a pixel array, so as to control, for example, the plurality of rows of gate lines to be turned on sequentially, and meanwhile data signals are provided by the data lines to pixel units in a corresponding row of the pixel array to form a display image in respective pixel units.

Touch screens can be classified into two types according to different structures: a type of touch screen is an external touch screen; and another type of touch screen is an integrated touch screen. The integrated touch screen includes an On-Cell touch screen and an In-Cell touch screen. In-Cell touch screen can be widely used because it can reduce an overall thickness of the touch screen and a manufacturing cost of the touch screen.

SUMMARY

At least one embodiment of the present disclosure provides a gate drive circuit, which includes a plurality of cascaded shift register units, each of the plurality of cascaded shift register units comprises a touch scanning control terminal, and the touch scanning control terminal is configured to receive a touch scanning control signal; and a voltage stabilization circuit connected to a first shift register unit and a group of second shift register units after the first shift register unit, of the plurality of cascaded shift register units, and configured to compensate a level of a first node of the group of second shift register units in response to the touch scanning control signal.

For example, in the gate drive circuit provided by an embodiment of the present disclosure, each of the plurality of cascaded shift register units further includes an input terminal which is configured to control the level of the first node according to an input signal, the voltage stabilization circuit is electrically connected to a first node of the first shift register unit and an input terminal of the group of second shift register units, and is configured to compensate the level of the first node of the group of second shift register units under control of the touch scanning control signal and a level of the first node of the first shift register unit.

For example, in the gate drive circuit provided by an embodiment of the present disclosure, the voltage stabilization circuit is configured to output the touch scanning control signal to the input terminal of the group of second shift register units to compensate the level of the first node of the group of second shift register units under control of the touch scanning control signal and the level of the first node of the first shift register unit.

For example, in the gate drive circuit provided by an embodiment of the present disclosure, the voltage stabilization circuit comprises an input sub-circuit, a voltage stabilization switch sub-circuit and an output sub-circuit; the input sub-circuit is configured to input the touch scanning control signal to the voltage stabilization switch sub-circuit in response to the touch scanning control signal; the voltage stabilization switch sub-circuit is configured to charge the first node of the first shift register unit; and the output sub-circuit is configured to output the touch scanning control signal to the input terminal of the group of second shift register units under control of the level of the first node of the first shift register unit.

For example, in the gate drive circuit provided by an embodiment of the present disclosure, the input sub-circuit comprises a first transistor, a gate electrode of the first transistor is connected to a first electrode of the first transistor and configured to receive the touch scanning control signal, and a second electrode of the first transistor is configured to be connected to the voltage stabilization switch sub-circuit.

For example, in the gate drive circuit provided by an embodiment of the present disclosure, the input sub-circuit comprises a first transistor, a gate electrode of the first transistor is configured to receive the touch scanning control signal, a first electrode of the first transistor is connected to the input terminal of the group of second shift register units, and a second electrode of the first transistor is configured to be connected to the voltage stabilization switch sub-circuit.

For example, in the gate drive circuit provided by an embodiment of the present disclosure, the voltage stabilization switch sub-circuit comprises a second transistor, a first electrode of the second transistor is configured to be connected to the second electrode of the first transistor, and a gate electrode of the second transistor is connected to a second electrode of the second transistor and is configured to be connected to the first node of the first shift register unit to charge the first node of the first shift register unit.

For example, in the gate drive circuit provided by an embodiment of the present disclosure, the output sub-circuit comprises a third transistor, a gate electrode of the third transistor is configured to be connected to the first node of the first shift register unit, a first electrode of the third transistor is configured to receive the touch scanning control signal, and a second electrode of the third transistor is configured to be connected to the input terminal of the group of second shift register units.

For example, in the gate drive circuit provided by an embodiment of the present disclosure, each of the plurality of cascaded shift register units further comprises an input terminal, and the voltage stabilization circuit is electrically connected to an input terminal of the group of second shift register units; the voltage stabilization circuit is configured to output a charging control signal to the input terminal of the group of second shift register units in response to the touch scanning control signal to compensate the level of the first node of the group of second shift register units.

For example, in the gate drive circuit provided by an embodiment of the present disclosure, each of the plurality of cascaded shift register units further comprises an output terminal, an input circuit, a first node reset circuit, an output circuit and a touch noise reduction circuit; an input circuit of an M-th stage of shift register unit in the plurality of cascaded shift register units is configured to charge a first node of the M-th stage of shift register unit in response to an input signal; a first node reset circuit of the M-th stage of shift register unit is configured to reset the first node of the M-th stage of shift register unit in response to a reset signal; an output circuit of the M-th stage of shift register unit is configured to output a clock signal to an output terminal of the M-th stage of shift register unit under control of a level of the first node of the M-th stage of shift register unit; and a touch noise reduction circuit of the M-th stage of shift register unit is configured to reset the output terminal of the M-th stage of shift register unit in response to the touch scanning control signal, and M is a positive integer and is less than or equal to an amount of the plurality of cascaded shift register units.

For example, in the gate drive circuit provided by an embodiment of the present disclosure, each of the plurality of cascaded shift register units further comprises a pull-down circuit, a pull-down control circuit, a first node noise reduction circuit, and an output noise reduction circuit; a pull-down circuit of the M-th stage of shift register unit is configured to control a level of a second node of the M-th stage of shift register unit under control of the level of the first node of the M-th stage of shift register unit and a level of a pull-down control node of the M-th stage of shift register unit; a pull-down control circuit of the M-th stage of shift register unit is configured to control the level of the pull-down control node of the M-th stage of shift register unit under control of the level of the first node of the M-th stage of shift register unit; a first node noise reduction circuit of the M-th stage of shift register unit is configured to perform noise reduction on the first node of the M-th stage of shift register unit under control of the level of the second node of the M-th stage of shift register unit; and an output noise reduction circuit of the M-th stage of shift register unit is configured to perform noise reduction on the output terminal of the M-th stage of shift register unit under control of the level of the second node of the M-th stage of shift register unit.

For example, the gate drive circuit provided by an embodiment of the present disclosure, further includes a first clock signal line and a second clock signal line; each of the plurality of cascaded shift register units further comprises a clock signal terminal, the first clock signal line is connected to a clock signal terminal of a (2N−1)-th stage of shift register unit of the plurality of cascaded shift register units, and the second clock signal line is connected to a clock signal terminal of a 2N-th stage of shift register unit of the plurality of cascaded shift register units; and N is an integer greater than 0.

For example, in the gate drive circuit provided by an embodiment of the present disclosure, each of the plurality of cascaded shift register units further comprises an input terminal, an output terminal and a reset terminal, and the group of second shift register units comprises one second shift register unit; an N-th stage of shift register unit of the plurality of cascaded shift register units is the first shift register unit, and a first node of the N-th stage of shift register unit is connected to the voltage stabilization circuit; an (N+1)-th stage of shift register unit of the plurality of cascaded shift register units is the second shift register unit, and an input terminal of the (N+1)-th stage of shift register unit is connected to the voltage stabilization circuit; except for a last stage of shift register unit, a reset terminal of an $n_1$-th stage of shift register unit of the plurality of cascaded shift register units is connected to an output terminal of an $(n_1+1)$-th stage of shift register unit of the plurality of cascaded shift register units; except for a first stage of shift register unit and the (N+1)-th stage of shift register unit, an input terminal of an $n_2$-th stage of shift register unit in the plurality of cascaded shift register units is connected to an output terminal of the $(n_2-1)$-th stage of shift register unit in the plurality of cascaded shift register units; and an amount of the plurality of cascaded shift register units is Q, N, Q, $n_1$ and $n_2$ are integers, $1<Q$, $1 \leq N<Q$, $0<n_1<Q$, $1<n_2 \leq Q$, and $n_2 \neq N+1$.

For example, the gate drive circuit provided by an embodiment of the present disclosure, further includes a first clock signal line, a second clock signal line, a third clock signal line, and a fourth clock signal line; each of the plurality of cascaded shift register units further includes a clock signal terminal, the first clock signal line is connected to a clock signal terminal of a $(4n_3-3)$-th stage of shift register unit of the plurality of cascaded shift register units, the second clock signal line is connected to a clock signal terminal of a $(4n_3-2)$-th stage of shift register unit of the plurality of cascaded shift register units, the third clock signal line is connected to a clock signal terminal of a $(4n_3-1)$-th stage of shift register unit of the plurality of cascaded shift register units, and the fourth clock signal line is connected to a clock signal terminal of a $4n_3$-th stage of shift register unit of the plurality of cascaded shift register units; and $n_3$ is an integer greater than 0.

For example, in the gate drive circuit provided by an embodiment of the present disclosure, each of the plurality of cascaded shift register units further comprises an input terminal, an output terminal and a reset terminal, and the group of second shift register units comprises two second shift register units; an (N−1)-th stage of shift register unit of the plurality of cascaded shift register units is the first shift register unit, and a first node of the (N−1)-th stage of shift register unit is connected to the voltage stabilization circuit; both an (N+1)-th stage of shift register unit and an (N+2)-th stage of shift register unit of the plurality of cascaded shift register units are the second shift register units, and both an input terminal of the (N+1)-th stage of shift register unit and an input terminal of the (N+2)-th stage of shift register unit are connected to the voltage stabilization circuit; except for last two stages shift register units, a reset terminal of an $n_4$-th stage of shift register unit of the plurality of cascaded shift register units is connected to an output terminal of an $(n_4-2)$-th stage of shift register unit of the plurality of cascaded shift register units; except for a first stage of shift register unit, a second stage of shift register unit, the (N+1)-th stage of shift register unit and the (N+2)-th stage of shift register unit, an input terminal of an $n_5$-th stage of shift register unit of the plurality of cascaded shift register units is connected to an output terminal of the $(n_5+2)$-th stage of shift register unit of the plurality of cascaded shift register units; and amount of the plurality of cascaded shift register units is Q, N, Q, $n_4$ and $n_5$ are integers, $3<Q$, $2 \leq N<Q-1$, $0<n_4<Q-1$, $2<n_5 \leq Q$, and $n_5 \neq N+1$, $n_5 \neq N+2$.

For example, the gate drive circuit provided by an embodiment of the present disclosure, further includes a touch scanning control signal line; the touch scanning control terminal of each of the plurality of cascaded shift register units and the voltage stabilization circuit are electrically connected to the touch scanning control signal line to receive the touch scanning control signal.

At least one embodiment of the present disclosure also provides a touch display device, which includes the gate drive circuit provided by any one of embodiments of the present disclosure.

At least one embodiment of the present disclosure also provides a driving method for driving a gate drive circuit, which includes: in a first phase, controlling the first shift register unit to output agate scanning signal; in a touch scanning phase, inputting the touch scanning control signal by a touch scanning control signal line, to compensate the level of the first node of the group of second shift register units; and in a second phase, controlling the group of second shift register units to output a group of gate scanning signals based on the level, which is compensated, of the first node of the group of second shift register units.

At least one embodiment of the present disclosure also provides a driving method for driving a gate drive circuit, which includes: in a first phase, controlling an output terminal of the N-th stage of shift register unit to output an N-th gate scanning signal; in a touch scanning phase, inputting the touch scanning control signal by a touch scanning control signal line, to compensate a level of a first node of the (N+1)-th stage of shift register unit; and in a second phase, controlling an output terminal of the (N+1)-th stage of shift register unit to output an (N+1)-th gate scanning signal based on the level, which is compensated, of the first node of the (N+1)-th stage of shift register unit.

At least one embodiment of the present disclosure also provides a driving method for driving a gate drive circuit, which includes: in a first phase, controlling an output terminal of the (N−1)-th stage of shift register unit to output an (N−1)-th gate scanning signal; in a third phase, controlling an output terminal of an N-th stage of shift register unit of the plurality of cascaded shift register units to output an N-th gate scanning signal; in a touch scanning phase, inputting the touch scanning control signal by a touch scanning control signal line, to compensate a level of a first node of the (N+1)-th stage of shift register unit and a level of a first node of the (N+2)-th stage of shift register unit; and in a second phase, controlling an output terminal of the (N+1)-th stage of shift register unit to output an (N+1)-th gate scanning signal based on the level, which is compensated, of the first node of the (N+1)-th stage of shift register unit, and controlling an output terminal of the (N+2)-th stage of shift register unit to output an (N+2)-th gate scanning signal based on the level, which is compensated, of the first node of the (N+2)-th stage of shift register unit.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
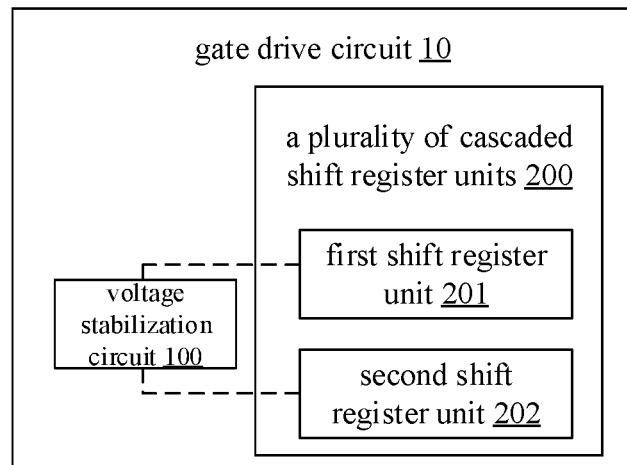
FIG. 1 is a schematic diagram of a gate drive circuit provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In display panel technologies, in order to realize a low cost and a narrow frame, GOA (Gate driver On Array) technologies may be adopted, i.e. a gate drive circuit is integrated in a display panel through thin film transistor technologies, thus realizing advantages such as narrow frame and reduced assembly cost. For example, GOA technologies can also be applied to touch screens. For In-Cell touch display screens, a part of an electrode structure (e.g., a common electrode) used for realizing a display operation can also be used for a touch operation in a time-sharing multiplex manner, and a display scanning drive circuit (e.g., GOA circuit) used for the display operation can be integrated with a touch scanning drive circuit used for the touch operation, i.e., Touch and Display Driver Integration (TDDI) technologies.

For example, in a display phase of a touch screen, a touch scanning phase can be inserted in a Blanking area (interval area) between two adjacent frames of display pictures to perform a touch scanning operation. In this case, a touch reporting rate of the touch screen is identical to a display frame rate of the touch screen, and both are 60 frames per second for example. As the size of the touch screen is increased gradually, the demand for touch reporting rate is also higher and higher. For example, when a user signs on a touch screen using a stylus, a higher touch reporting rate (for example, higher than 100 frames per second) is required to meet the requirement of smooth signature.

For example, a method to improve the touch reporting rate is to insert a plurality of touch scanning phases in the display phase of a frame of image of an In-Cell touch display screen. Although the touch scanning method effectively improves the touch reporting rate of the touch screen, potentials of pull-up nodes of a first few shift register units after the touch scanning phase are decreased due to influence of current leakage of a thin film transistor (abbreviated as TFT) in the touch scanning phase, which may lead to output voltages of the first few shift register units after the touch scanning phase to be insufficient, thus causing TFTs in corresponding rows of gate lines to be insufficiently turned on, further causing poor display phenomena, such as horizontal lines at fixed positions and the like, in a display area.

At least one embodiment of the present disclosure provides a gate drive circuit, which includes a plurality of cascaded shift register units and a voltage stabilization circuit. Each of the plurality of cascaded shift register units includes a touch scanning control terminal, and the touch scanning control terminal is configured to receive a touch scanning control signal. The voltage stabilization circuit is connected to a first shift register unit and a group of second shift register units after the first shift register unit, of the plurality of cascaded shift register units, and is configured to compensate a level of a first node of the group of second shift register units in response to the touch scanning control signal. Embodiments of the present disclosure also provide a touch display device and a driving method corresponding to the gate drive circuit.

The gate drive circuit, the touch display device and the driving method provided by the embodiments of the disclosure can charge the first node of adjacent shift register units through the voltage stabilization circuit in a touch scanning phase to ensure a level stability of the first node of the adjacent shift register units after the first shift register unit, so that the phenomenon of abnormal output, such as horizontal lines at fixed positions and the like, caused by too low potential of the first node of the shift register units, can be avoided, and display qualities can be further improved.

Embodiments of the present disclosure and examples thereof are described in detail below with reference to accompanying drawings.

FIG. 1 is a schematic diagram of a gate drive circuit provided by an embodiment of the present disclosure. As shown in FIG. 1, the gate drive circuit 10 includes a voltage stabilization circuit 100 and a plurality of cascaded shift register units 200.

For example, each of the plurality of cascaded shift register units 200 includes a touch scanning control terminal (not shown in the figure), which is configured to receive a touch scanning control signal. For example, the plurality of cascaded shift register units 200 may include a first shift register unit 201 and a group of second shift register units 202 after the first shift register unit for cooperating with the voltage stabilization circuit 100. For example, the voltage stabilization circuit 100 is configured to compensate a level of a first node of the group of second shift register units 202 in response to the touch scanning control signal.

For example, in the present disclosure, the group of second shift register units 202 includes at least one second shift register unit, that is, the group of second shift register units 202 may include one second shift register unit or may include more than one second shift register units (e.g., two, three, etc.).

For example, the first node may be a pull-up node.

It should be noted that in the present disclosure, the term "compensating the level of the first node of the group of second shift register units 202" may mean charging the first node of the group of second shift register units 202 to compensate for the attenuation of a voltage of the first node of the group of second shift register units 202 in a touch scanning phase.

Figure 6:
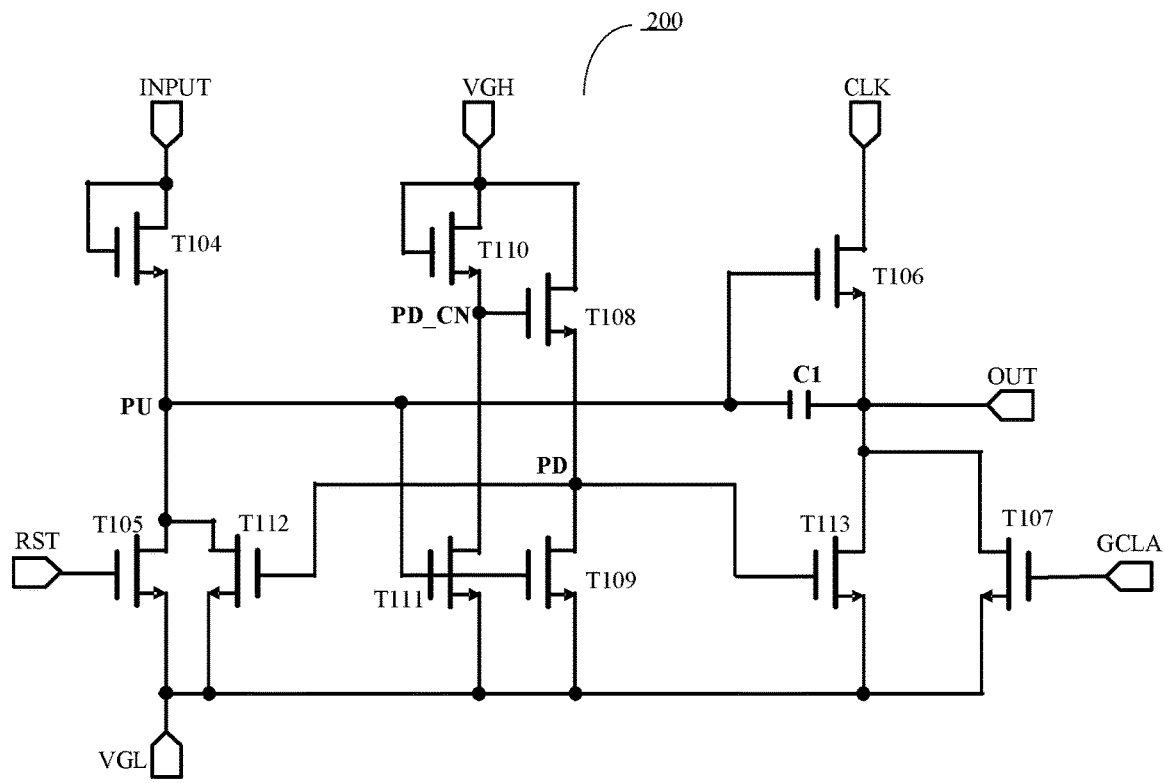
FIG. 6 is a circuit schematic diagram of the shift register unit as shown in FIG. 5B.
Figure 8:
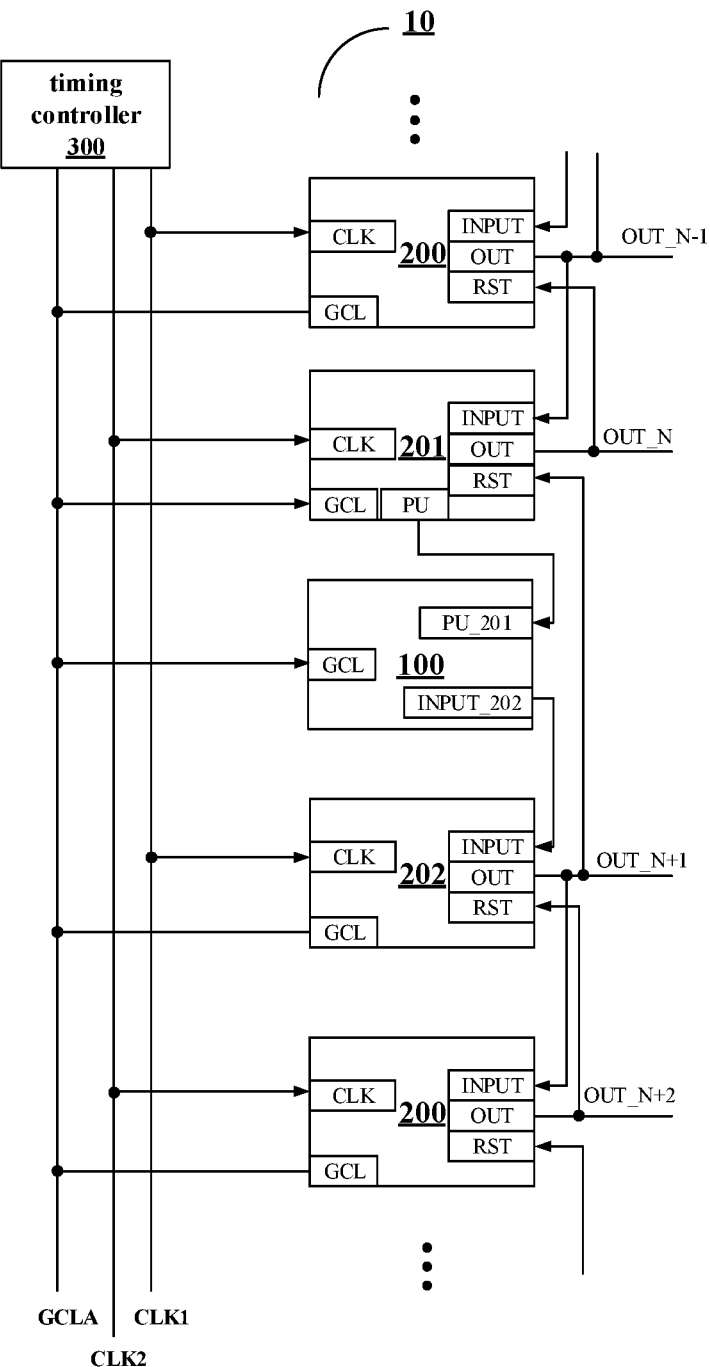
FIG. 8 is a schematic diagram of a gate drive circuit provided by an embodiment of the present disclosure.

For example, one of the shift register units 200 before the voltage stabilization circuit 100 may be set as the first shift register unit 201. For example, the setting of the first shift register unit 201 is related to an amount of clock signal lines (not shown). For example, in an example, in a case where the gate drive circuit 10 includes two clock signal lines (an example as shown in FIG. 6 below), a previous stage of shift register unit adjacent to the voltage stabilization circuit 100 may be set as the first shift register unit 201; also for example, in another example, in a case where the gate drive circuit 10 includes four clock signal lines (an example as shown in FIG. 8 below), a previous stage of shift register unit separated from the voltage stabilization circuit 100 by one stage of shift register unit may be set as the first shift register unit 201. It should be noted that the embodiments of the present disclosure are not limited to these cases. For example, in a case where the gate drive circuit 10 includes six clock signal lines, a previous stage of shift register unit separated from the voltage stabilization circuit 100 by two stages of shift register units may be set as the first shift register unit 201; and in a case where eight clock signal lines are included, a previous stage of shift register unit separated from the voltage stabilization circuit 100 by three stages of shift register units can be set as the first shift register unit 201. It should be noted that the embodiments of the present disclosure are not limited to these cases. For example, as the amount of clock signal lines increases, the amount of stages separating the first shift register unit 201 from the voltage stabilization circuit 100 correspondingly increases, and the specific connection method will be described in detail in the following embodiments.

For example, at least one shift register unit after the voltage stabilization circuit 100 may be set as the group of second shift register units 202. For example, in the present disclosure, the group of second shift register units 202 are sequentially connected after and adjacent to the voltage stabilization circuit 100, and the group of second shift register units 202 includes at least one second shift register unit 202. It should be noted that the amount of second shift register units 202 is related to the amount of clock signal lines. For example, in an example, in a case where the gate drive circuit 10 includes two clock signal lines (the example as shown in FIG. 6 below), the group of second shift register units 202 of the gate drive circuit 10 includes one second shift register unit 202; and for another example, as shown in FIG. 8, in a case where the gate drive circuit 10 includes four clock signal lines (the example as shown in FIG. 8 below), the group of second shift register units 202 of the gate drive circuit 10 includes two second shift register units 202. It should be noted that the embodiments of the present disclosure are not limited to this case. For example, in a case where the gate drive circuit 10 includes six clock signal lines, the group of second shift register units 202 of the gate drive circuit 10 includes three second shift register units 202; and in a case where the gate drive circuit 10 includes eight clock signal lines, the group of second shift register units 202 of the gate drive circuit 10 includes four second shift register units 202. It should be noted that the embodiments of the present disclosure are not limited to these cases. For example, as the amount of clock signal lines increases, the amount of second shift register units 202 correspondingly increases, and the specific connection method will be described in detail in the following embodiments.

For example, the voltage stabilization circuit 100 may be connected between the first shift register unit 201 and the group of second shift register units 202 (at least one second shift register unit). For example, each of the plurality of cascaded shift register units 200 further includes an input terminal, which is configured to control the level of the first node according to an input signal in each shift register unit.

For example, the voltage stabilization circuit 100 may be electrically connected to a first node of the first shift register unit 201 and an input terminal of the group of second shift register units 202. For example, the voltage stabilization circuit 100 is configured to compensate the level of the first node of the group of second shift register units under control of the touch scanning control signal and a level of the first node of the first shift register unit 201. For example, in an example, the voltage stabilization circuit 100 is configured to output the touch scanning control signal to the input terminal of the group of second shift register units 202 under control of the touch scanning control signal and the level of the first node of the first shift register unit 201, thereby realizing charging the first node of the group of second shift register units 202 to compensate the level of the first node of the group of second shift register units 202 in the touch scanning phase. Therefore, the phenomenon of abnormal display, such as horizontal lines at fixed positions and the like, caused by too low potentials of the first node of the first few shift register units (i.e., the group of second shift register units 202) after the touch scanning phase is finished, and display qualities can be further improved.

It should be noted that the first shift register unit 201 and the second shift register unit 202 are illustrated for distinguishing from other shift register units which are not connected to the voltage stabilization circuit. In the gate drive circuit 10, other shift register units, which are not connected to the voltage stabilization circuit 100, may adopt the shift register unit 200 provided by the embodiments of the present disclosure, and the shift register unit 200 will be described in detail bellow. A structure of the first shift register unit 201 and a structure of the second shift register unit 202 are identical to structures of other shift register units 200 which are not connected to the voltage stabilization circuit 100.

Figure 2:
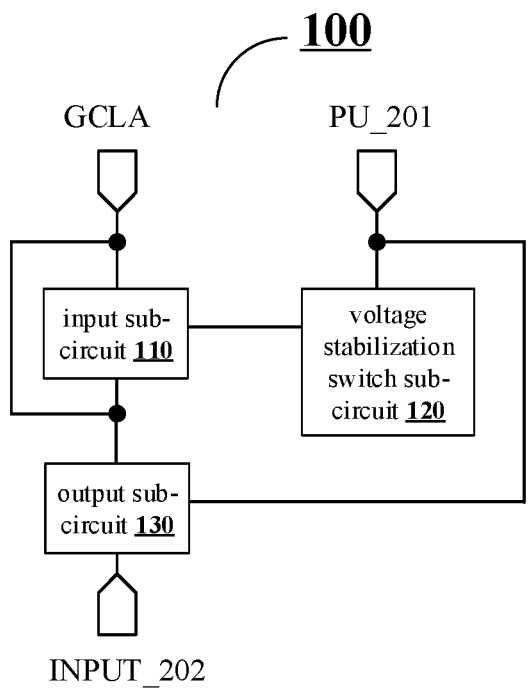
FIG. 2 is a schematic diagram of a voltage stabilization circuit provided by an embodiment of the present disclosure.

FIG. 2 is a schematic diagram of a voltage stabilization circuit provided by an embodiment of the present disclosure. As shown in FIG. 2, the voltage stabilization circuit 100 includes an input sub-circuit 110, a voltage stabilization switch sub-circuit 120, and an output sub-circuit 130.

The input sub-circuit 110 is configured to input the touch scanning control signal to the voltage stabilization switch sub-circuit 120 in response to the touch scanning control signal. For example, as shown in FIG. 2, the input sub-circuit 110 may be electrically connected to a touch scanning control signal line GCLA and the voltage stabilization switch sub-circuit 120, respectively, the touch scanning control signal line GCLA is used to provide the touch scanning control signal, and the input sub-circuit 110 is configured to be turned on under control of the touch scanning control signal and input the touch scanning control signal to the voltage stabilization switch sub-circuit 120.

The voltage stabilization switch sub-circuit 120 is configured to charge the first node of the first shift register unit 201. For example, as shown in FIG. 2, the voltage stabilization switch sub-circuit 120 may be electrically connected to the first node PU_201 of the first shift register unit. When the voltage stabilization switch sub-circuit 120 is turned on under control of the level of the first node PU_201 of the first shift register unit 201, the voltage stabilization switch sub-circuit 120 may receive the touch scanning control signal transmitted from the input sub-circuit 110 and transmit the touch scanning control signal to the first node PU_201 of the first shift register unit to charge the first node PU_201 of the first shift register unit, and meanwhile the level of the first node PU_201 of the first shift register unit 201 also maintains the voltage stabilization switch sub-circuit 120 in a turned-on state.

Figure 5A:
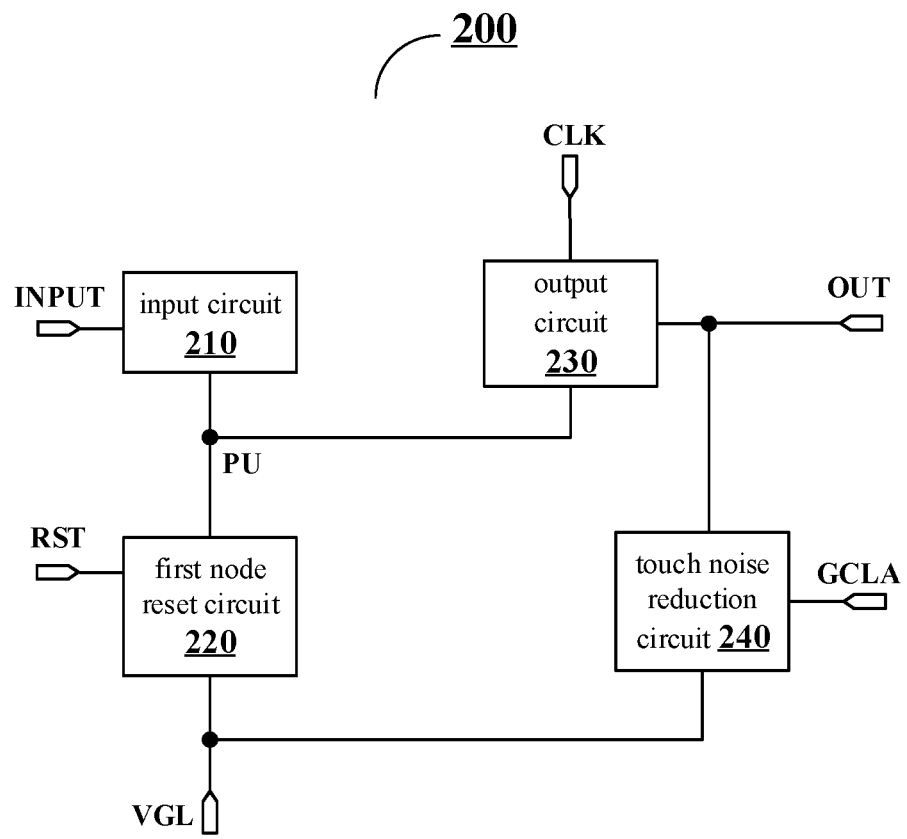
FIG. 5A is a schematic diagram of a shift register unit provided by an embodiment of the present disclosure.

The output sub-circuit 130 is configured to output the touch scanning control signal to the input terminal of the group of second shift register units 202 under control of the level of the first node PU_201 of the first shift register unit. For example, as shown in FIG. 2, the output sub-circuit 130 may be electrically connected to the input sub-circuit 110, the first node PU_201 of the first shift register unit 201, and the input terminal INPUT_202 of the group of second shift register units 202, respectively. In a case where the output sub-circuit 130 is turned on under control of the level of the first node PU_201 of the first shift register unit 201, the output sub-circuit 130 may output the touch scanning control signal to the input terminal INPUT_202 of the group of second shift register units 202. For example, the output sub-circuit 130 may be configured to be turned on under control of the level of the first node PU_201 of the first shift register unit 201 to electrically connect the touch scanning control signal line GCLA with the input terminal INPUT_202 of the group of second shift register units 202, thereby outputting the touch scanning control signal of the touch scanning control signal line GCLA to the input terminal INPUT_202 of the group of second shift register units 202. For example, in some examples, the touch scanning control signal may control an input circuit of the group of second shift register units 202 (e.g., an input circuit 210 as shown in FIG. 5A and to be described below) to be turned on, and meanwhile, in the group of second shift register units 202, each input circuit 210 may respectively pre-charge each corresponding first node PU_202 by the touch scanning control signal to compensate for the attenuation of the level of the first node PU_202 of the group of second shift register units 202, so that the level of the first node PU_202 of the group of second shift register units 202 can be kept stable.

It should be noted that the output sub-circuit 130 may not be electrically connected to the first node PU_201 of the first shift register unit 201. For example, the output sub-circuit 130 may be electrically connected to a single output control signal line. In this situation, the output sub-circuit 130 may be turned on under control of an output control signal of the output control signal line to output the touch scanning control signal to the input terminal INPUT_202 of the second shift register unit 202. In this situation, the voltage stabilization switch sub-circuit 120 is optional, that is, the voltage stabilization circuit 100 may include the voltage stabilization switch sub-circuit 120 or may not include the voltage stabilization switch sub-circuit 120.

Figure 3A:
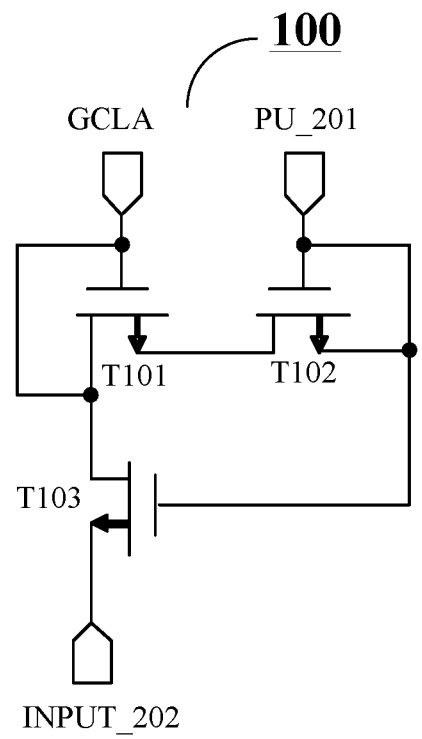
FIG. 3A is a circuit schematic diagram of an implementation example of the voltage stabilization circuit as shown in FIG. 2.

For example, the voltage stabilization circuit 100 as shown in FIG. 2 may be implemented as a circuit structure as shown in FIG. 3A in an example.

For example, as shown in FIG. 3A, in the example, the input sub-circuit 110 may include a first transistor T101 in more detail. A gate electrode of the first transistor T101 is connected to a first electrode of the first transistor T101 and is configured to be connected to the touch scanning control signal line GCLA to receive the touch scanning control signal, and a second electrode of the first transistor T101 is configured to be connected to the voltage stabilization switch sub-circuit 120.

For example, as shown in FIG. 3A, the voltage stabilization switch sub-circuit 120 may include a second transistor T102. A first electrode of the second transistor T102 is configured to be connected to the second electrode of the first transistor T101, a gate electrode of the second transistor T102 is connected to a second electrode of the second transistor T102, and is configured to be connected to the first node PU_201 of the first shift register unit 201, so that the second transistor T102 can be controlled by a potential of the first node PU_201, and meanwhile, in a case where the second transistor T102 is turned on under control of the potential of the first node PU_201, the second transistor T102 can charge the first node PU_201 of the first shift register unit 201 through the received touch scanning control signal.

For example, as shown in FIG. 3A, the output sub-circuit 130 may include a third transistor T103. A gate electrode of the third transistor T103 is configured to be connected to the first node PU_201 of the first shift register unit 201, a first electrode of the third transistor T103 is connected to the touch scanning control signal line GCLA to receive the touch scanning control signal, meanwhile, the first electrode of the third transistor T3 is also connected to the first electrode of the first transistor T101, and a second electrode of the third transistor T103 is configured to be connected to the input terminal INPUT_202 of the second shift register unit 202.

Figure 3B:
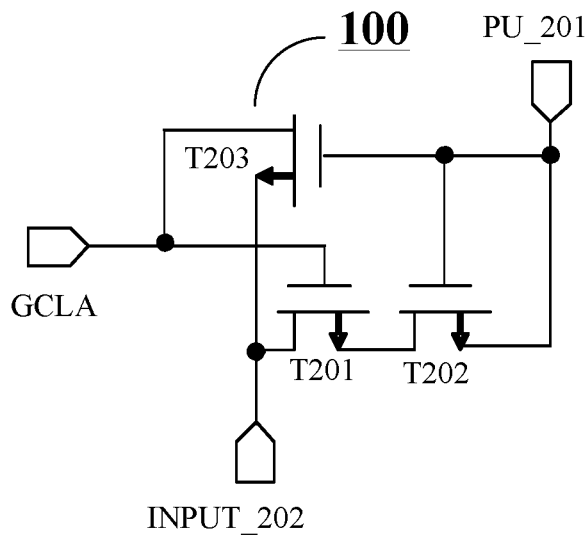
FIG. 3B is a circuit schematic diagram of another implementation example of the voltage stabilization circuit as shown in FIG. 2.

For example, in another example, the voltage stabilization circuit 100 as shown in FIG. 2 may also be implemented as a circuit structure as shown in FIG. 3B.

For example, as shown in FIG. 3B, in the example, the input sub-circuit 110 may include a first transistor T201. A gate electrode of the first transistor T201 is configured to be connected to the touch scanning control signal line GCLA to receive the touch scanning control signal, a first electrode of the first transistor T201 is connected to the input terminal INPUT_202 of the second shift register unit 202, and a second electrode of the first transistor T201 is configured to be connected to the voltage stabilization switch sub-circuit 120.

For example, as shown in FIG. 3B, the voltage stabilization switch sub-circuit 120 may include a second transistor T202. A first electrode of the second transistor T202 is configured to be connected to the second electrode of the first transistor T201, a gate electrode of the second transistor T202 is connected to a second electrode of the second transistor T202, and is configured to be connected to the first node PU_201 of the first shift register unit 201, so that the second transistor T202 can be controlled by the potential of the first node PU_201, and meanwhile, in a case where the second transistor T202 is turned on under control of the potential of the first node PU_201, the second transistor T202 can charge the first node PU_201 of the first shift register unit 201 through the received touch scanning control signal.

For example, as shown in FIG. 3B, the output sub-circuit 130 may include a third transistor T203. A gate electrode of the third transistor T203 is configured to be connected to the first node PU_201 of the first shift register unit 201, a first electrode of the third transistor T203 is configured to be connected to the touch scanning control signal line GCLA to receive the touch scanning control signal, and a second electrode of the third transistor T203 is configured to be connected to the input terminal INPUT_202 of the second shift register unit 202 and the first electrode of the first transistor T201.

In the above example, the embodiments are described by taking a case that the first transistor T101, the second transistor T102, the third transistor T103, the first transistor T201, the second transistor T202, and the third transistor T203 are described as N-type transistors for example, but the embodiment of the present disclosure is not limited to this case, and may be implemented by at least partially using P-type transistors as required.

Figure 4:
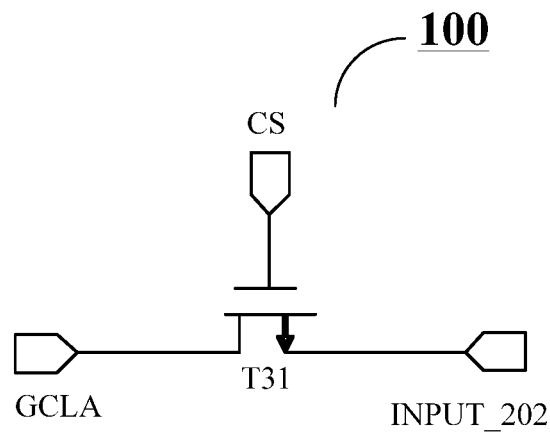
FIG. 4 is a circuit schematic diagram of another voltage stabilization circuit provided by an embodiment of the disclosure.

FIG. 4 is a circuit schematic diagram of another voltage stabilization circuit provided by an embodiment of the disclosure. For example, in some embodiments, the voltage stabilization circuit 100 is electrically connected to the input terminal INPUT_202 of the group of second shift register units 202, and the voltage stabilization circuit 100 is configured to output the touch scanning control signal to the input terminal INPUT_202 of the group of second shift register units 202 to compensate the level of the first node of the group of second shift register units 202, for example, under control of a compensation control signal.

For example, as shown in FIG. 4, the voltage stabilization circuit 100 includes a first transistor T31. A gate electrode of the first transistor T31 is electrically connected to a compensation control line CS to receive the compensation control signal, a first electrode of the first transistor T31 is electrically connected to the touch scanning control signal line GCLA, and a second electrode of the first transistor T31 is electrically connected to the input terminal INPUT_202 of the group of second shift register units 202. In a case where the first transistor T31 is turned on under control of the compensation control signal, the first transistor T31 can output the touch scanning control signal to the input terminal INPUT_202 of the group of second shift register units 202.

FIG. 5A is a schematic diagram of a shift register unit 200 provided by an embodiment of the disclosure. As shown in FIG. 5A, the shift register unit 200 includes an output terminal OUT, an input circuit 210, a first node reset circuit 220, an output circuit 230, and a touch noise reduction circuit 240.

Next, a structure of the shift register unit will be described in detail by taking an M-th shift register unit of the plurality of cascaded shift register units as an example, and M is a positive integer and is less than or equal to the amount of the plurality of cascaded shift register units.

For example, as shown in FIG. 5A, in the M-th shift register unit, the input circuit 210 is configured to charge the first node PU in response to the input signal. For example, the input circuit 210 may be connected to the input terminal INPUT and the first node PU, and is configured to electrically connect the first node PU with the input terminal INPUT under control of a signal input by the input terminal INPUT, so that a high-level signal input by the input terminal INPUT may charge the first node PU to increase the voltage of the first node PU to control the output circuit 230 to be turned on.

For example, as shown in FIG. 5A, in the M-th shift register unit, the first node reset circuit 220 is configured to reset the first node PU in response to a reset signal. For example, the first node reset circuit 220 may be configured to be connected to a reset terminal RST, so that the first node PU may be electrically connected to a low voltage terminal to receive a low voltage signal under control of the reset signal input from the reset terminal RST, and the low voltage terminal is, for example, a first voltage terminal VGL, which may pull down and reset the first node PU. It should be noted that, for example, the first voltage terminal VGL may be configured to keep inputting a DC low-level signal, which is the same in following embodiments and will not be described again.

For example, as shown in FIG. 5A, in the M-th shift register unit, the output circuit 230 is configured to, under control of the level of the first node PU, output a clock signal, as an output signal of the shift register unit 200, to the output terminal OUT, to drive, for example, a gate line connected to the output terminal OUT. For example, the output circuit 230 may be configured to be turned on under control of the level of the first node PU to electrically connect a clock signal terminal CLK with the output terminal OUT, so that the clock signal input by the clock signal terminal CLK may be output to the output terminal OUT.

For example, as shown in FIG. 5A, in the M-th shift register unit, the touch noise reduction circuit 240 is configured to reset the output terminal OUT in response to the touch scanning control signal. For example, the touch noise reduction circuit 240 may be configured to be connected to the touch scanning control signal line GCLA. Under control of the touch scanning control signal input by the touch scanning control signal line GCLA, the touch noise reduction circuit 240 may electrically connect the output terminal OUT with the first voltage terminal VGL, so that the touch noise reduction circuit 240 may reset the output terminal OUT and perform a noise reduction on the output terminal OUT under control of the touch scanning control signal input by the touch scanning control signal line GCLA.

For example, the above-mentioned plurality of cascaded shift register units 200 may be adopted to constitute a gate drive circuit. In a case where the gate drive circuit is used to drive the display device, a potential of the output terminal OUT can be controlled by the touch noise reduction circuit 240, so that display abnormality caused by the influence of the clock signal on the output terminal OUT of the shift register unit can be avoided, and meanwhile, the interference caused by the influence of output abnormality of the shift register unit on the touch scanning control signal can be avoided, so that the display quality of the display device can be improved.

Figure 5B:
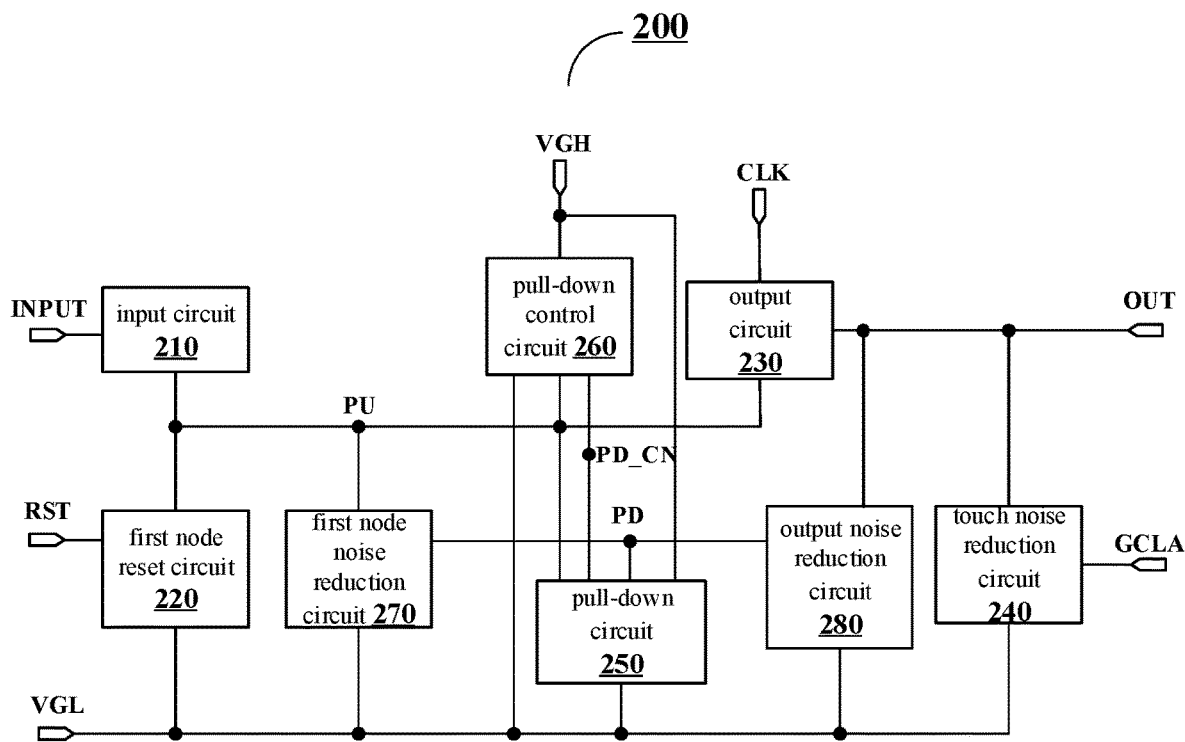
FIG. 5B is a schematic diagram of another shift register unit provided by an embodiment of the present disclosure.

FIG. 5B is a schematic diagram of another shift register unit 200 provided by an embodiment of the present disclosure. For example, as shown in FIG. 5B, in another example of the embodiment of the present disclosure, the shift register unit 200 may further include a pull-down circuit 250, a pull-down control circuit 260, a first node noise reduction circuit 270, and an output noise reduction circuit 280.

For example, as shown in FIG. 5B, in the M-th shift register unit, the pull-down circuit 250 is configured to control a level of a second node PD under control of the level of the first node PU and a level of a pull-down control node PD_CN, thereby controlling the first node noise reduction circuit 270 and the output noise reduction circuit 280.

For example, the second node may be a pull-down node.

For example, as shown in FIG. 5B, the pull-down circuit 250 may connect the first voltage terminal VGL, a second voltage terminal VGH, the first node PU, the second node PD, and the pull-down control node PD_CN to electrically connect the second node PD with the first voltage terminal VGL under control of the level of the first node PU, thereby performing a pull-down control on the level of the second node PD to allow the level of the second node PD to be at a low potential. Meanwhile, the pull-down circuit 250 can electrically connect the second node PD with the second voltage terminal VGH under control of the level of the pull-down control node PD_CN, thereby charging the second node PD to a high potential. For example, the second voltage terminal VGH may be configured to keep inputting a DC high-level signal, which is the same in the following embodiments of the present disclosure and will not be described in detail.

For example, as shown in FIG. 5B, in the M-th shift register unit, the pull-down control circuit 260 is configured to control the level of the pull-down control node PD_CN under control of the level of the first node PU. For example, the pull-down control circuit 260 may connect the first voltage terminal VGL, the second voltage terminal VGH, the first node PU and the pull-down control node PD_CN to electrically connect the pull-down control node PD_CN with the first voltage terminal VGL under control of the level of the first node PU, thereby controlling the level of the pull-down control node PD_CN.

For example, as shown in FIG. 5B, in the M-th shift register unit, the first node noise reduction circuit 270 is configured to perform noise reduction on the first node PU under control of the level of the second node PD. For example, the first node noise reduction circuit 270 may be configured to be connected to the first voltage terminal VGL to electrically connect the first node PU with the first voltage terminal VGL under control of the level of the second node PD, thereby performing pulling down and noise reduction on the first node PU.

For example, as shown in FIG. 5B, in the M-th shift register unit, the output noise reduction circuit 280 is configured to perform noise reduction on the output terminal OUT under control of the level of the second node PD. For example, the output noise reduction circuit 280 may be configured to electrically connect the output terminal OUT with the first voltage terminal VGL under control of the level of the second node PD, thereby performing pulling down and noise reduction on the output terminal OUT.

For example, the shift register unit 200 as shown in FIG. 5B may be implemented as a circuit structure as shown in FIG. 6 in an example. In the following description, the embodiments are described by taking a case that each transistor is an N-type transistor as an example, but the embodiments of the present disclosure are not limited to this case.

For example, as shown in FIG. 6, the input circuit 210 may be implemented as a fourth transistor T104. A gate electrode of the fourth transistor T104 is connected to a first electrode of the fourth transistor T104, and is configured to be connected to the input terminal INPUT to receive the input signal, and a second electrode of the fourth transistor T104 is configured to be connected to the first node PU, so that in a case where the fourth transistor T104 is turned on in response to a turned-on signal (a high-level signal)

received by the input terminal INPUT, the turned-on signal is used to charge the first node PU to a high level.

For example, as shown in FIG. 6, the first node reset circuit 220 may be implemented as a fifth transistor T105. A gate electrode of the fifth transistor T105 is configured to be connected to the reset terminal RST to receive the reset signal, a first electrode of the fifth transistor T105 is configured to be connected to the first node PU, and a second electrode of the fifth transistor T105 is configured to be connected to the first voltage terminal VGL (a voltage terminal) to receive a first voltage. In a case where the fifth transistor T105 is turned on under control of the reset signal, the first node PU is electrically connected to the first voltage terminal VGL, so that the first node PU can be reset to a low level from a high level.

For example, as shown in FIG. 6, the output circuit 230 may be implemented to include a sixth transistor T106 and a storage capacitor C1. A gate electrode of the sixth transistor T106 is configured to be connected to the first node PU, a first electrode of the sixth transistor T106 is configured to be connected to the clock signal terminal CLK to receive the clock signal, and a second electrode of the sixth transistor T106 is configured to be connected to the output terminal OUT; and a first electrode of the storage capacitor C1 is configured to be connected to the gate electrode of the sixth transistor T106, and a second electrode of the storage capacitor C1 is connected to the second electrode of the sixth transistor T106.

For example, as shown in FIG. 6, the touch noise reduction circuit 240 may be implemented as a seventh transistor T107. A gate electrode of the seventh transistor T107 is configured to be connected to the touch scanning control signal line GCLA to receive the touch scanning control signal, a first electrode of the seventh transistor T107 is configured to be connected to the output terminal OUT, and a second electrode of the seventh transistor T107 is configured to be connected to the first voltage terminal VGL to receive the first voltage. In a case where the seventh transistor T107 is turned on under control of the touch scanning control signal, the output terminal OUT is connected to the first voltage terminal VGL, so that the output terminal OUT can be reset and denoised.

It should be noted that, in the embodiment of the present disclosure, the first voltage terminal VGL, for example, continues to input a DC low-level signal, which is referred to as the first voltage; and the second voltage terminal VGH, for example, continues to input a DC high-level signal, which is referred to as a second voltage, which is the same in following embodiments and will not be described again.

For example, as shown in FIG. 6, the pull-down circuit 250 may include an eighth transistor T108 and a ninth transistor T109. A gate electrode of the eighth transistor T108 is configured to be connected to the pull-down control node PD_CN, a first electrode of the eighth transistor T108 is configured to be connected to the second voltage terminal VGH to receive the second voltage, and a second electrode of the eighth transistor T108 is configured to be connected to the second node PD; and a gate electrode of the ninth transistor T109 is configured to be connected to the first node PU, a first electrode of the ninth transistor T109 is configured to be connected to the second node PD, and a second electrode of the ninth transistor T109 is configured to be connected to the first voltage terminal VGL to receive the first voltage.

For example, as shown in FIG. 6, the pull-down control circuit 260 may include a tenth transistor T110 and an eleventh transistor T111. A gate electrode of the tenth transistor T110 is connected to a first electrode of the tenth transistor T110 and is configured to be connected to the second voltage terminal VGH to receive the second voltage, and a second electrode of the tenth transistor T110 is configured to be connected to the pull-down control node PD_CN; and a gate electrode of the eleventh transistor T111 is configured to be connected to the first node PU, a first electrode of the eleventh transistor T111 is configured to be connected to the pull-down control node PD_CN, and a second electrode of the eleventh transistor T111 is configured to be connected to the first voltage terminal VGL to receive the first voltage.

For example, as shown in FIG. 6, the first node noise reduction circuit 270 may include a twelfth transistor T112. A gate electrode of the twelfth transistor T112 is configured to be connected to the second node PD, a first electrode of the twelfth transistor T112 is configured to be connected to the first node PU, and a second electrode of the twelfth transistor T112 is configured to be connected to the first voltage terminal VGL to receive the first voltage. In a case where the second node PD is at a high potential, the twelfth transistor T112 is turned on, the first node PU is connected to the first voltage terminal VGL, so that the first node PU can be pulled down to realize noise reduction.

For example, as shown in FIG. 6, the output noise reduction circuit 280 may include a thirteenth transistor T113. A gate electrode of the thirteenth transistor T113 is configured to be connected to the second node PD, a first electrode of the thirteenth transistor T113 is configured to be connected to the output terminal OUT, and a second electrode of the thirteenth transistor T113 is configured to be connected to the first voltage terminal VGL to receive the first voltage. In a case where the second node PD is at a high potential, the thirteenth transistor T113 is turned on to connect the output terminal OUT with the first voltage terminal VGL, so that the output terminal OUT can be denoised.

It should be noted that the transistors used in the embodiments of the present disclosure may all be thin film transistors or field effect transistors or other switching devices with the same characteristics, and the embodiments of the present disclosure are described by taking the thin film transistors as an example. A source electrode and a drain electrode of each transistor used here may be symmetrical in structure, so no difference may be between the source electrode and the drain electrode of the transistor in structure. In the embodiments of the present disclosure, in order to distinguish the two electrodes of the transistor except a gate electrode, one of the two electrodes is directly described as a first electrode, and the other is described as a second electrode.

In addition, the transistors in the embodiments of the present disclosure are all described by taking an N-type transistor as an example. In this case, a first electrode of each transistor is the drain electrode, and a second electrode of the transistor is the source electrode. It should be noted that the present disclosure includes but is not limited to this case. For example, one or more transistors in the shift register unit provided by the embodiment of the present disclosure may also adopt P-type transistors. In this case, a first electrode of each transistor is the source electrode, a second electrode of the transistor is the drain electrode, as long as the respective electrodes of selected-type transistors are correspondingly connected, with polarities in accordance with the polarities of the respective electrodes of the respective transistors in the embodiment of the present disclosure.

For example, as shown in FIG. 6, the transistors of the shift register unit 200 are all N-type transistors, the first voltage terminal VGL continues to input the first voltage with a DC low level, the second voltage terminal VGH continues to input the second voltage with a DC high level, the clock signal terminal CLK inputs the clock signal, and the touch scanning control signal line GCLA inputs the touch scanning control signal.

Figure 7A:
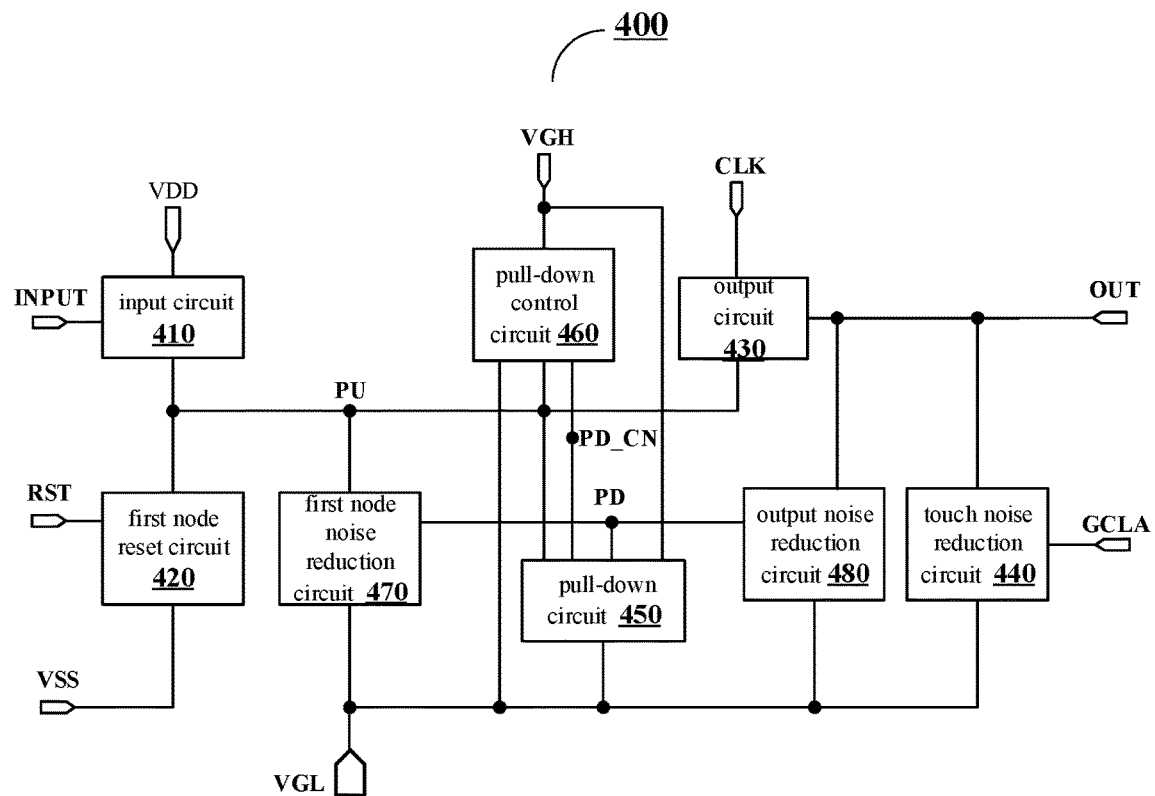
FIG. 7A is a schematic diagram of another shift register unit provided by an embodiment of the present disclosure.
Figure 7B:
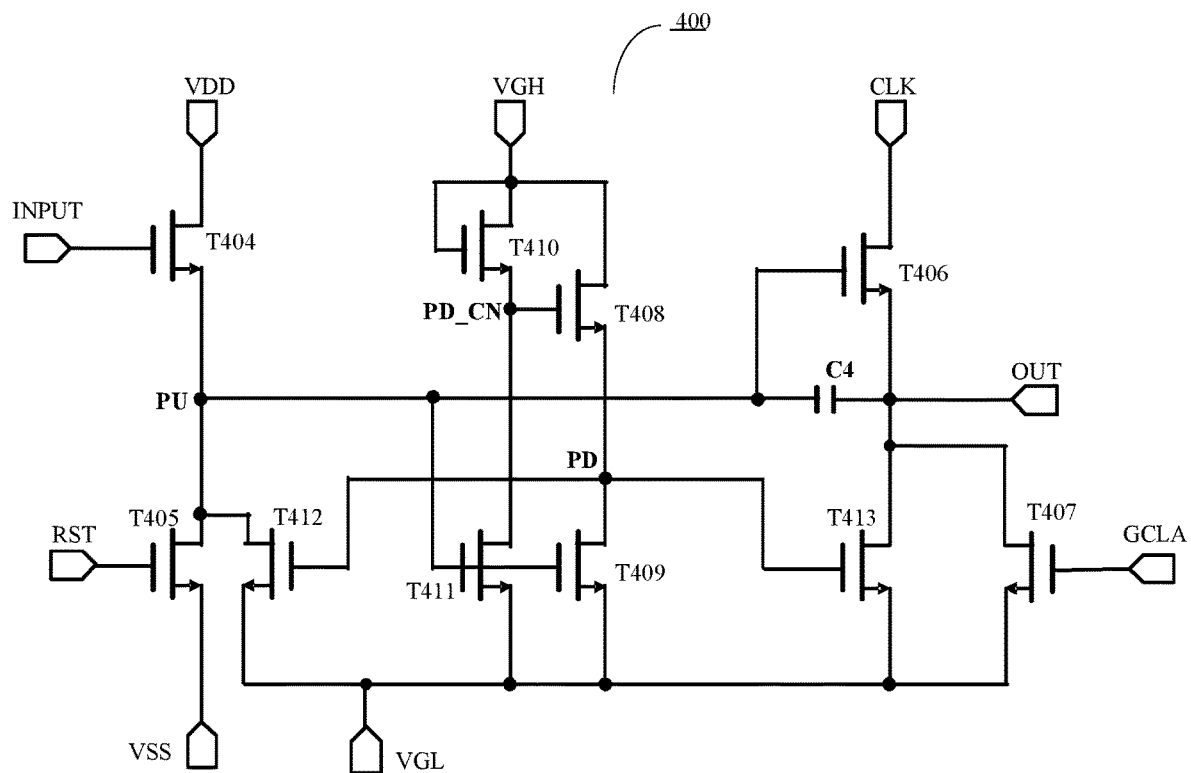
FIG. 7B is a circuit schematic diagram of the shift register unit as shown in FIG. 7A.

FIG. 7A is a schematic diagram of another shift register unit 400 provided by an embodiment of the present disclosure. For example, the shift register unit 400 as shown in FIG. 7A can be implemented as a circuit structure as shown in FIG. 7B in an example. In the following description, the embodiments are described by taking a case that each transistor is an N-type transistor as an example, but the embodiments of the present disclosure are not limited to this case.

For example, as shown in FIGS. 7A and 7B, in another example of the embodiments of the present disclosure, a shift register unit 400 may include an output terminal OUT, an input circuit 410, a first node reset circuit 420, an output circuit 430, a touch noise reduction circuit 440, a pull-down circuit 450, a pull-down control circuit 460, a first node noise reduction circuit 470, and an output noise reduction circuit 480. Similarly, the output circuit 430, the touch noise reduction circuit 440, the pull-down circuit 450, the pull-down control circuit 460, the first node noise reduction circuit 470, and the output noise reduction circuit 480 are the same in structure and connection manner as the output circuit 230, the touch noise reduction circuit 240, the pull-down circuit 250, the pull-down control circuit 260, the first node noise reduction circuit 270, and the output noise reduction circuit 280 of the shift register unit 200 as shown in FIG. 5B and FIG. 6, respectively, and are not described in detail here. Only the differences between the shift register unit 400 as shown in FIG. 7A and the shift register unit 200 as shown in FIG. 5B are described below. Similarly, a structure of the shift register unit is described in detail below by taking an M-th shift register unit in the cascaded shift register units as an example, and M is a positive integer and is less than or equal to the amount of the cascaded shift register units.

For example, as shown in FIG. 7A, in the M-th shift register unit, the input circuit 410 is configured to charge the first node PU in response to an input signal. For example, the input circuit 410 may be connected to the input terminal INPUT, a third power supply terminal VDD and the first node PU, and is configured to electrically connect the first node PU with the third power supply terminal VDD under control of a signal input from the input terminal INPUT, so that a high-level signal output from the third power supply terminal VDD may charge the first node PU to increase the voltage of the first node PU to control the output circuit 430 to be turned on. For example, the third power supply terminal VDD may be configured to provide a third voltage (e.g., a DC high-level signal), which is the same in the following embodiments of the present disclosure and will not be described again.

For example, as shown in FIG. 7A, in the M-th shift register unit, the first node reset circuit 420 is configured to reset the first node PU in response to a reset signal. For example, the first node reset circuit 220 may be configured to be connected to the reset terminal RST, so that the first node PU may be electrically connected to a fourth voltage terminal VSS to receive a low-voltage signal under control of the reset signal input from the reset terminal RST, and the fourth voltage terminal VSS may pull down and reset the first node PU. It should be noted that the fourth voltage terminal VSS may be configured to output a fourth voltage (e.g., a DC low-level signal), for example, which is the same in the following embodiments and will not be described in detail.

For example, as shown in FIG. 7B, the input circuit 410 may be implemented as a fourth transistor T404. A gate electrode of the fourth transistor T404 is configured to be connected to the input terminal INPUT to receive the input signal, a first electrode of the fourth transistor T404 is configured to be connected to the third power supply terminal VDD, and a second electrode of the fourth transistor T404 is configured to be connected to the first node PU, so that in a case where the fourth transistor T104 is turned on in response to a turned-on signal (a high-level signal) received by the input terminal INPUT, the high-level signal output from the third power supply terminal VDD is used to charge the first node PU to a high level.

For example, as shown in FIG. 7B, the first node reset circuit 420 may be implemented as a fifth transistor T405. A gate electrode of the fifth transistor T405 is configured to be connected to the reset terminal RST to receive the reset signal, a first electrode of the fifth transistor T405 is configured to be connected to the first node PU, and a second electrode of the fifth transistor T405 is configured to be connected to the fourth voltage terminal VSS to receive the fourth voltage. In a case where the fifth transistor T405 is turned on under control of the reset signal, the first node PU is electrically connected to the first voltage terminal VGL, so that the first node PU can be reset from a high level to a low level by the first voltage.

For example, as shown in FIG. 7B, the output circuit 430 may be implemented to include a sixth transistor T406 and a storage capacitor C4; the touch noise reduction circuit 440 may be implemented as a seventh transistor T107; the pull-down circuit 450 may include an eighth transistor T408 and a ninth transistor T409; the pull-down control circuit 460 may include a tenth transistor T410 and an eleventh transistor T411; the first node noise reduction circuit 470 may include a twelfth transistor T412; and the output noise reduction circuit 480 may include a thirteenth transistor T413. The relevant descriptions of the sixth transistor T406, the storage capacitor C4, the seventh transistor T107, the eighth transistor T408, the ninth transistor T409, the tenth transistor T410, the eleventh transistor T411, the twelfth transistor T412, and the thirteenth transistor T413 may refer to the relevant descriptions in the above example as shown in FIG. 6 and will not be repeated here.

FIG. 8 is a schematic diagram of a gate drive circuit 10 according to an embodiment of the present disclosure. For example, as shown in FIG. 8, an example of an embodiment of the present disclosure provides a gate drive circuit 10 including at least one voltage stabilization circuit 100, a plurality of cascaded shift register units 200, a touch scanning control signal line GCLA, a first clock signal line CLK1, and a second clock signal line CLK2. For example, the plurality of cascaded shift register units 200 includes a first shift register unit 201 and one second shift register unit 202, which correspond to each voltage stabilization circuit 100, i.e., the group of second shift register units 202 includes only one second shift register unit 202.

For example, as shown in FIG. 8, each of the plurality of cascaded shift register units 200 includes a clock signal terminal CLK, an input terminal INPUT, an output terminal OUT, and a reset terminal RST, and is configured to be connected to the first clock signal line CLK1 or the second clock signal line CLK2 to receive the first clock signal or a second clock signal. The first clock signal line CLK1 is connected to the clock signal terminal CLK of a (2n−1)-th (n is an integer greater than 0) stage of shift register unit of the plurality of cascaded shift register units 200, and the second clock signal line CLK2 is connected to the clock signal terminal CLK of a (2n)-th stage of shift register unit of the plurality of cascaded shift register units 200. It should be noted that the embodiment of the present disclosure includes but is not limited to the above-mentioned connection mode. For example, the first clock signal line CLK1 may be connected to the clock signal terminal CLK of the (2n)-th(n is an integer greater than 0) stage of shift register unit, and the second clock signal line CLK2 may be connected to the clock signal terminal CLK of the (2n−1)-th of stage of shift register unit.

It should be noted that OUT_N−1 as shown in FIG. 8 represents an output terminal of an (N−1)-th stage of shift register unit, OUT_N represents an output terminal of an N-th stage of shift register unit, OUT_N+1 represents an output terminal of an (N+1)-th stage of shift register unit, and OUT_N+2 represents an output terminal of an (N+2)-th stage of shift register unit. Reference numerals in the following embodiments are similar to reference numerals of the embodiments and will not be repeated here.

For example, as shown in FIG. 8, the voltage stabilization circuit 100 is between an N-th (N is an integer greater than 1) stage of shift register unit and an (N+1)-th stage of shift register unit. The N-th shift register unit is the first shift register unit 201. A first node PU of the N-th stage of shift register unit 201 is connected to the voltage stabilization circuit 100. The (N+1)-th stage of shift register unit is the second shift register unit 202, and the input terminal INPUT of the (N+1)-th stage of shift register unit 202 is connected to the output terminal INPUT_202 of the voltage stabilization circuit 100.

For example, as shown in FIG. 8, the touch scanning control terminal GCL of each shift register unit and the touch scanning control terminal GCL of the voltage stabilization circuit 100 are connected to the touch scanning control signal line GCLA to receive the touch scanning control signal.

For example, as shown in FIG. 8, except for a last stage of shift register unit, a reset terminal RST of each stage of shift register units is connected to an output terminal OUT of a next stage of shift register unit. Except for a first stage of shift register unit and the (N+1)-th stage of shift register units 202, an input terminal INPUT of each stage of shift register unit is connected to an output terminal OUT of a previous stage of shift register unit. That is, a reset terminal RST of an $n_1$-th stage of shift register unit of the plurality of cascaded shift register units 200 is connected to an output terminal OUT of an $(n_1+1)$-th stage of shift register unit of the plurality of cascaded shift register units 200. Except for a first stage of shift register unit and the (N+1)-th stage of shift register unit 202, an input terminal INPUT of an $n_2$-th stage of shift register unit in the plurality of cascaded shift register units 200 is connected to an output terminal OUT of the $(n_2-1)$-th stage of shift register unit in the plurality of cascaded shift register units 200. The amount of the plurality of cascaded shift register units is Q, and N, Q, $n_1$ and $n_2$ are integers; $1<Q$, $1 \leq N<Q$, $0<n_1<Q$, $1<n_2 \leq Q$, and $n_2 \neq N+1$.

For example, an input terminal INPUT of the first stage of shift register unit may be configured to receive a trigger signal STV, a reset terminal RST of the last stage of shift register unit may be configured to receive a reset signal RESET, and the trigger signal STV and the reset signal RESET are not shown in FIG. 8.

For example, as shown in FIG. 8, the gate drive circuit 10 may further include a timing controller 300. For example, the timing controller 300 may be configured to be connected to the touch scanning control signal line GCLA, the first clock signal line CLK1, and the second clock signal line CLK2 to provide the touch scanning control signal and clock signals (e.g., the first clock signal and the second clock signal) to each shift register unit. For example, the timing controller 300 may also be configured to provide the trigger signal STV and the reset signal RESET.

Figure 9:
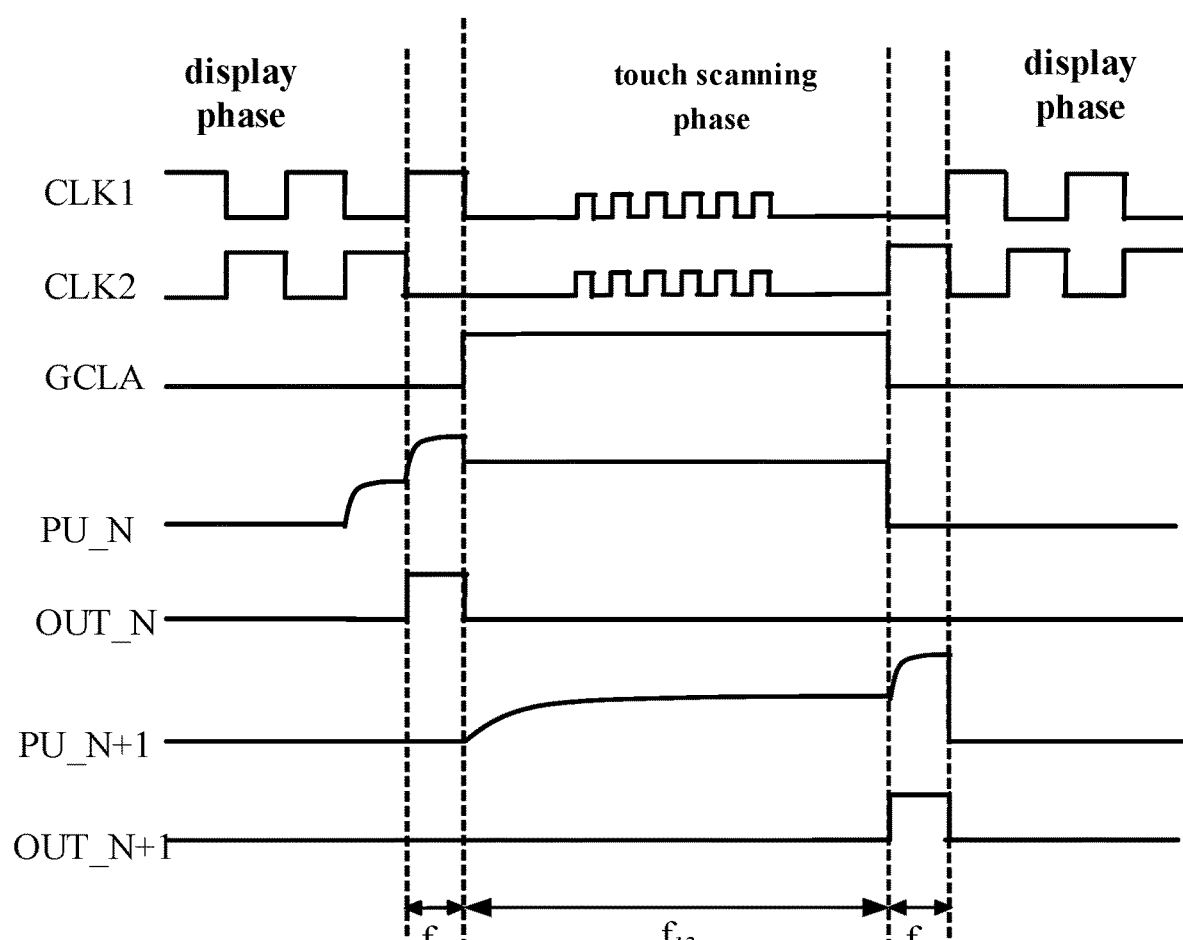
FIG. 9 is a signal timing chart corresponding to the gate drive circuit as shown in FIG. 8 in operation.

For example, a clock signal sequence provided by the first clock signal line CLK1 and a clock signal sequence provided by the second clock signal line CLK2 may adopt a signal sequence as shown in FIG. 9 to allow the gate drive circuit 10 to realize a function of outputting a gate scanning signal line by line.

Next, the operation principle of the gate drive circuit 10 as shown in FIG. 8 will be described with reference to the signal sequence diagram as shown in FIG. 9. In three phases of a first phase $f_{11}$, a touch scanning phase $f_{13}$ and a second phase $f_{12}$ as shown in FIG. 9, the gate drive circuit 10 can respectively perform the following operations.

It should be noted that, as shown in FIG. 9, in the example, the touch scanning phase $f_{13}$ is inserted between the first phase $f_{11}$ and the second phase $f_{12}$.

In the first phase $f_{11}$, the first clock signal line CLK1 provides a high-level signal. Because a clock signal terminal CLK of the N-th stage of shift register unit 201 is connected to the first clock signal line CLK1, a high-level signal is input to the clock signal terminal CLK of the N-th stage of shift register unit 201 in this phase. Because the first node PU_N of the N-th stage of shift register unit 201 is at a high level, under control of the high level of the first node PU_N, the high level input by the clock signal terminal CLK of the N-th stage of shift register unit 201 is output to the output terminal OUT_N of the N-th stage of shift register unit 201. It should be noted that the high level and the low level of potentials in the signal sequence diagram as shown in FIG. 9 are only schematic and do not represent a true potential value or a relative proportion. Corresponding to the above example, the high-level signal corresponds to a turn-on signal of the N-type transistor, while the low-level signal corresponds to a turn-off signal of the N-type transistor.

Next, as shown in FIG. 9, in the touch scanning phase $f_{13}$, the touch scanning control signal line GCLA provides a high-level signal. Because the touch scanning control terminal GCL of the voltage stabilization circuit 100 is connected to the touch scanning control signal line GCLA, the touch scanning control terminal GCL of the voltage stabilization circuit 100 inputs a high-level signal at this phase. For example, in an example, as shown in FIG. 3A, the touch scanning control terminal GCL of the voltage stabilization circuit 100 may include the gate electrode of the first transistor T101 and the first electrode of the third transistor T103. In a case where the touch scanning control terminal GCL of the voltage stabilization circuit 100 inputs a high level, the first transistor T101 is turned on. Meanwhile, at this phase, because the potential of the first node PU_N of the N-th shift register unit 201 is at a high level, the second transistor T102 can be turned on, so that the high level input by the touch scanning control terminal GCL of the voltage stabilization circuit 100 charges the first node PU_N of the N-th stage of shift register unit 201 through the first transistor T101 and the second transistor T102, thereby preventing the first node PU_N from being attenuated due to TFT current leakage in the touch scanning phase. Meanwhile, because the first node PU_N of the N-th stage of shift register unit 201 is at a high level, the third transistor T103 is also turned on, so that the high level input by the touch scanning control terminal GCL of the voltage stabilization circuit 100 can charge the first node PU_N+1 of the (N+1)-th stage of shift register unit 202 through the third transistor T103, charging the first node PU_N+1 to a first high level of potential.

For example, in another example, as shown in FIG. 3B, the touch scanning control terminal GCL of the voltage stabilization circuit 100 may include the gate electrode of the first transistor T201 and the first electrode of the third transistor T203, the high level of the first node PU_N of the N-th stage of shift register unit 201 turns on the third transistor T203, so that the high level input by the touch scanning control terminal GCL of the voltage stabilization circuit 100 can charge the first node PU_N+1 of the (N+1)-th stage of shift register unit 202 through the third transistor T203, charging the potential of the first node PU_N+1 to the first high level. At the same time, at this phase, in a case where the touch scanning control terminal GCL of the voltage stabilization circuit 100 inputs a high level, the first transistor T201 is turned on, and the high level of the first node PU_N of the N-th stage of shift register unit 201 turns on the second transistor T202. Therefore, the high level input by the touch scanning control terminal GCL of the voltage stabilization circuit 100 charges the first node PU_N of the N-th stage of shift register unit 201 through all of the third transistor T203, the first transistor T201 and the second transistor T202 to prevent the first node PU_N from being attenuated due to TFT current leakage in the touch scanning phase.

It should be noted that at this phase, because the touch scanning control terminal GCL of each stage of shift register unit is connected to the touch scanning control signal line GCLA, the touch scanning control terminal GCL of each stage of shift register unit inputs a high-level signal at this phase. As shown in FIG. 6 and FIG. 7B, the high level input from the touch scanning control terminal GCL of each stage of shift register unit can also turn on the seventh transistor (e.g., the seventh transistor T107 as shown in FIG. 6 and the seventh transistor T407 as shown in FIG. 7) of each stage of shift register unit, and can further pull down a potential of the output terminal OUT of each stage of shift register unit, thereby outputting a low-level signal to realize noise reduction. The low-level signal can enable switching transistors of corresponding pixel units of a display array to be in a turn-off state.

Meanwhile, in the touch scanning phase $f_{13}$, the touch scanning control signal triggers a touch scanning drive circuit to scan a touch panel or a touch circuit, which may be a self-capacitance touch circuit or a mutual-capacitance touch circuit, and the embodiment of the present disclosure is not limited in this aspect.

Next, as shown in FIG. 9, the second phase $f_{12}$ is entered after the touch scanning phase $f_{13}$ is finished.

In the second phase $f_{12}$, the second clock signal line CLK2 provides a high-level signal. Because the clock signal terminal CLK of the (N+1)-th stage of shift register unit 202 is connected to the second clock signal line CLK2, a high-level signal is input to the clock signal terminal CLK of the (N+1)-th stage of shift register unit 202 at this phase. The high level input by the clock signal terminal CLK of the (N+1)-th stage of shift register unit 202 causes the potential of the first node PU_N+1 of the (N+1)-th stage of shift register unit 202 to be further pulled up to a second high level. Therefore, under control of the second high level of the first node PU_N+1, the high level input by the clock signal terminal CLK of the (N+1)-th stage of shift register unit 202 is output to the output terminal OUT_N+1 of the (N+1)-th stage of shift register unit 202.

Figure 10:
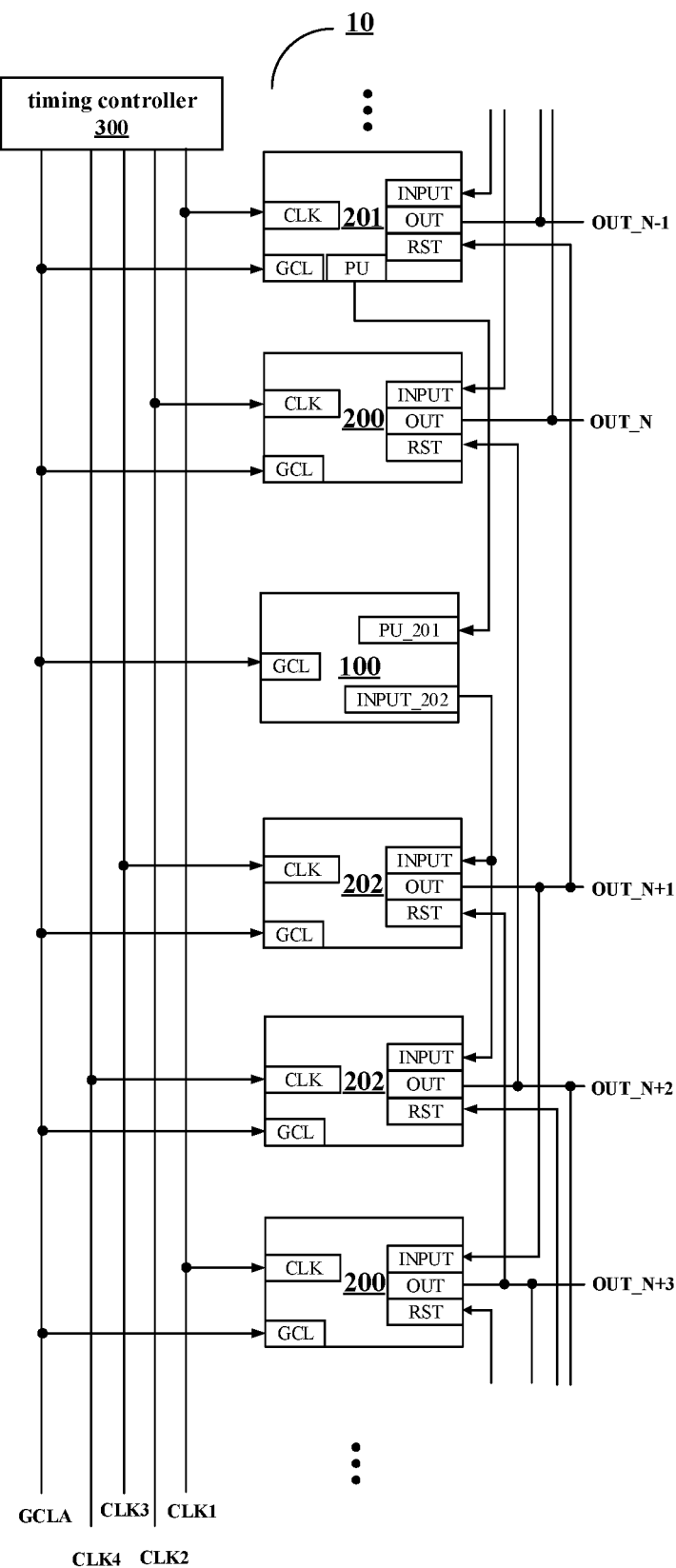
FIG. 10 is a schematic diagram of another gate drive circuit provided by an embodiment of the present disclosure.

FIG. 10 is a schematic diagram of another gate drive circuit 10 provided by an embodiment of the present disclosure. As shown in FIG. 10, the gate drive circuit 10 includes at least an voltage stabilization circuit 100, a plurality of cascaded shift register units 200, a touch scanning control signal line GCLA, a first clock signal line CLK1, a second clock signal line CLK2, a third clock signal line CLK3, and a fourth clock signal line CLK4. For example, the plurality of cascaded shift register units may include a first shift register unit 201 and two second shift register units 202 for each voltage stabilization circuit 100, i.e., the group of second shift register units 202 includes two second shift register units 202.

For example, as shown in FIG. 10, each of the plurality of cascaded shift register units 200 includes a clock signal terminal CLK, an input terminal INPUT, an output terminal OUT, and a reset terminal RST, and is configured to be connected to the first clock signal line CLK1, the second clock signal line CLK2, the third clock signal line CLK3, or the fourth clock signal line CLK4 to receive a first clock signal, a second clock signal, a third clock signal, or a fourth clock signal. The first clock signal line CLK1 is connected to, for example, a clock signal terminal of a $(4n_3-3)$-th ($n_3$ is an integer greater than 0) stage of shift register unit of the plurality of cascaded shift register units 200; the second clock signal line CLK2 is connected to, for example, a clock signal terminal of a $(4n_3-2)$-th stage of shift register unit of the plurality of cascaded shift register units 200; the third clock signal line CLK3 is connected to, for example, a clock signal terminal of a $(4n_3-1)$-th stage of shift register unit of the plurality of cascaded shift register units 200; and the fourth clock signal line CLK4 is connected to, for example, a clock signal terminal of a $4n_3$-th stage of shift register unit of the plurality of cascaded shift register units 200.

For example, as shown in FIG. 10, the voltage stabilization circuit 100 is between the N-th (N is an integer greater than 2) stage of shift register unit and the (N+1)-th stage of shift register unit. The (N−1)-th stage of shift register unit 200 of the cascades shift units 200 is the first shift register unit 201. A first node PU of the (N−1)-th stage of shift register unit 201 is connected to the voltage stabilization circuit 100. Both the (N+1)-th stage of shift register unit and the (N+2)-th stage of shift register unit of the plurality of cascaded shift register units 200 are the second shift register units 202, and both an input terminal INPUT of the (N+1)-th stage of shift register unit 202 and an input terminal INPUT of the (N+2)-th stage of shift register unit 202 are connected to the output terminal INPUT_202 of the voltage stabilization circuit 100.

For example, as shown in FIG. 10, except for last two stages of shift register units, a reset terminals RST of each stage of shift register unit is connected to an output terminal OUT of a next stage of shift register unit which is spaced by one stage. Except for the shift register units 202 in a first stage, a second stage, the (N+1)-th stage and the (N+2)-th stage, an input terminal INPUT of each stage of shift register unit is connected to an output terminal OUT of a previous stage of shift register units which is spaced by one stage. That is, except for the last two stages of shift register units, a reset terminal RST of an $n_4$-th stage of shift register unit of the plurality of cascaded shift register units is connected to an output terminal OUT of an $(n_4-2)$-th stage of shift register unit of the plurality of cascaded shift register units; and except for the first stage of shift register unit, the second stage of shift register unit, the (N+1)-th stage of shift register unit and the (N+2)-th stage of shift register unit, an input terminal INPUT of an $n_5$-th stage of shift register unit of the plurality of cascaded shift register units is connected to an output terminal OUTPUT of the ($n_5$+2)-th stage of shift register unit of the plurality of cascaded shift register units. For example, the amount of the plurality of cascaded shift register units is Q, and N, Q, $n_4$ and $n_5$ are integers, 3<Q, 2≤N<Q−1, 0<$n_4$<Q−1, 2<$n_5$≤Q, and $n_5$≠N+1, $n_5$≠N+2.

It should be noted that in the embodiments of the present disclosure, a term, that a shift register unit B is a next stage of shift register unit of another shift register unit A, indicates that a gate scanning signal output by the shift register unit B is later in time than a gate scanning signal output by the shift register unit A. Correspondingly, a term, that a shift register unit B is a previous stage of shift register unit of another shift register unit A, indicates that the gate scanning signal output by the shift register unit B is earlier in time than the gate scanning signal output by the shift register unit A, which is the same in following embodiments and will not be described again.

For example, an input terminal INPUT of the first stage of shift register unit may be configured to receive a trigger signal STV, a reset terminal RST of the last stage of shift register unit may be configured to receive a reset signal RESET, and the trigger signal STV and the reset signal RESET are not shown in FIG. 10.

For example, as shown in FIG. 10, the gate drive circuit 10 may further include a timing controller 300. For example, the timing controller 300 may be configured to be connected to the touch scanning control signal line GCLA, the first clock signal line CLK1, the second clock signal line CLK2, the third clock signal line CLK3 and the fourth clock signal line CLK4 to provide the touch scanning control signal and clock signals (e.g., the first clock signal, the second clock signal, the third clock signal and the fourth clock signal) to each shift register unit. The timing controller 300 may also be configured to provide the trigger signal STV and the reset signal RESET.

Figure 11:
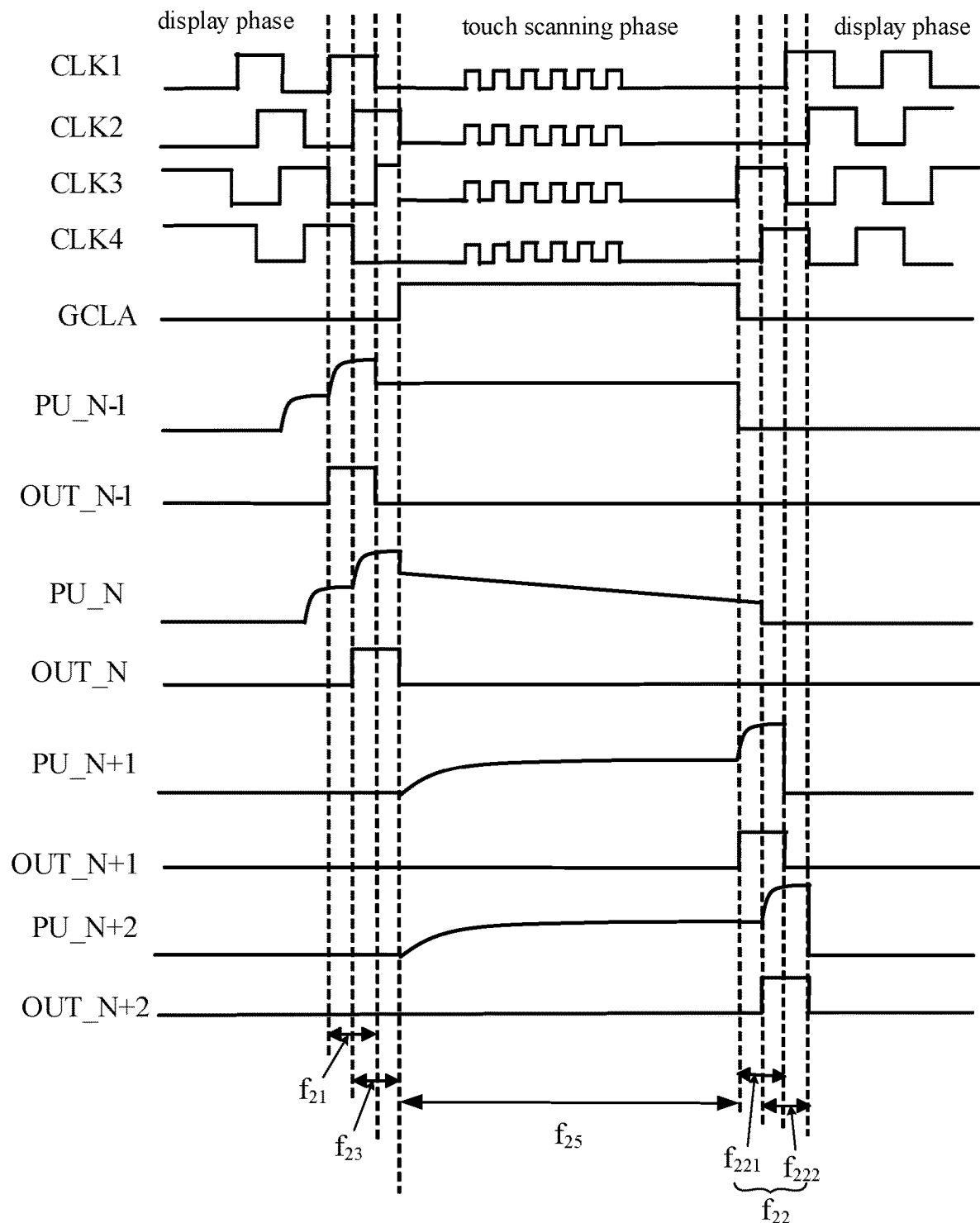
FIG. 11 is a signal sequence diagram corresponding to the gate drive circuit as shown in FIG. 10 in operation.

For example, a clock signal sequence provided by the first clock signal line CLK1, a clock signal sequence provided by the second clock signal line CLK2, a clock signal sequence provided by the third clock signal line CLK3 and a clock signal sequence provided by the fourth clock signal line CLK4 may adopt a signal sequence as shown in FIG. 11 to allow the gate drive circuit 10 to realize a function of outputting a gate scanning signal line by line.

The clock signal on the clock signal line may be attenuated during transmission, which may cause a charging voltage of the following gate line to be insufficient. The load of each clock signal line can be reduced by providing clock signals to the shift register units of the gate drive circuit through a plurality of clock signal lines, thereby improving the charging rate.

It should be noted that the gate drive circuit provided in the embodiments of the present disclosure may also include more clock signal lines such as six, eight clock signal lines, and the embodiments of the present disclosure is not limited to this case.

Next, the operation principle of the gate drive circuit 10 as shown in FIG. 10 will be described with reference to the signal sequence diagram as shown in FIG. 11. In a first phase $f_{21}$, a second phase $f_{22}$, a touch scanning phase $f_{25}$, and a third phase $f_{23}$ as shown in FIG. 11, the gate drive circuit 10 can respectively perform the following operations.

It should be noted that, as shown in FIG. 11, in the example, the second phase $f_{22}$ includes a first sub-phase $f_{221}$ and a second sub-phase $f_{222}$, and the touch scanning phase $f_{25}$ is inserted between the first sub-phase $f_{221}$ of the second phase $f_{22}$ and the third phase $f_{23}$.

In the first phase $f_{21}$, the first clock signal line CLK1 provides a high-level signal. Because a clock signal terminal CLK of the (N−1)-th stage of shift register unit 201 is connected to the first clock signal line CLK1, the clock signal terminal CLK of the shift register unit 201 of the (N−1)-th stage inputs a high-level signal at this phase. Also, because the first node PU_N−1 of the (N−1)-th stage of shift register unit 201 is at a high level, under control of the high level of the first node PU_N−1 of the (N−1)-th stage of shift register unit 201, the high level input by the clock signal terminal CLK of the (N−1)-th stage of shift register unit 201 is output to the output terminal OUT_N−1 of the (N−1)-th stage of shift register unit 101. It should be noted that the high and low level of potential in the signal sequence diagram as shown in FIG. 11 is only schematic and does not represent a true potential value.

In the third phase $f_{23}$, the second clock signal line CLK2 provides a high-level signal. Because the clock signal terminal CLK of the N-th stage of shift register unit 200 is connected to the second clock signal line CLK2, a high-level signal is input to the clock signal terminal CLK of the N-th stage of shift register unit 200 at this phase. Also, because the first node PU_N of the N-th stage of shift register unit 200 is at a high level, under control of the high level of the first node PU_N of the N-th stage of shift register unit 200, the high level input by the clock signal terminal CLK of the N-th stage of shift register unit 200 is output to the output terminal OUT_N of the N-th stage of shift register unit 101.

Next, as shown in FIG. 11, in the touch scanning phase $f_{25}$, the touch scanning control signal line GCLA provides a high-level signal. Because the touch scanning control terminal GCL of the voltage stabilization circuit 100 is connected to the touch scanning control signal line GCLA, the touch scanning control terminal GCL of the voltage stabilization circuit 100 inputs a high-level signal at this phase. In an example, as shown in FIG. 3A, the touch scanning control terminal GCL of the voltage stabilization circuit 100 may include the gate electrode of the first transistor T101 and the first electrode of the third transistor T103. In a case where the touch scanning control terminal GCL of the voltage stabilization circuit 100 inputs a high level, the first transistor T101 is turned on. Meanwhile, at this phase, because a potential of the first node PU_N−1 of the shift register unit 201 of the (N−1)-th stage is at a high level, the second transistor T102 can be turned on, so that the high level input by the touch scanning control terminal GCL of the voltage stabilization circuit 100 charges the first node PU_N−1 of the (N−1)-th stage of shift register unit 201 through the first transistor T101 and the second transistor T102, thereby preventing the first node PU_N−1 from being attenuated due to TFT current leakage during the touch scanning phase. Meanwhile, because the first node PU_N−1 of the (N−1)-th stage of shift register unit 201 is at a high level, the third transistor T103 is turned on. Therefore, the high level input by the touch scanning control terminal GCL of the voltage stabilization circuit 100 can charge the first node PU_N+1 of the (N+1)-th stage of shift register unit 202 and the first node PU_N+2 of the (N+2)-th stage of shift register unit 202 through the third transistor T103, so that a potential of the first node PU_N+1 of the (N+1)-th stage of shift register unit 202 and a potential of the first node PU_N+2 of the (N+2)-th stage of shift register unit 202 are charged to a first high level.

For example, in another example, as shown in FIG. 3B, the touch scanning control terminal GCL of the voltage stabilization circuit 100 may include the gate electrode of the first transistor T201 and the first electrode of the third transistor T203, and a high level of the first node PU_N−1 of the (N−1)-th stage of shift register unit 201 turns on the third transistor T203. Therefore, the high level input by the touch scanning control terminal GCL of the voltage stabilization circuit 100 can charge the first node PU_N+1 of the (N+1)-th stage of shift register unit 202 and the first node PU_N+2 of the (N+2)-th stage of shift register unit 202 through the third transistor T203, so that the potential of the first node PU_N+1 of the (N+1)-th stage of shift register unit 202 and the potential of the first node PU_N+2 of the (N+2)-th stage of shift register unit 202 are charged to the first high level. Meanwhile, at this phase, in a case where a high level is input to the touch scanning control terminal GCL of the voltage stabilization circuit 100, the first transistor T201 is turned on, and a high level of the first node PU_N−1 of the (N−1)-th stage of shift register unit 201 turns on the second transistor T202. Therefore, a high level input from the touch scanning control terminal GCL of the voltage stabilization circuit 100 charges the first node PU_N−1 of the (N−1)-th stage of shift register unit 201 through all of the third transistor T203, the first transistor T201 and the second transistor T202 to prevent the first node PU_N−1 from being attenuated due to TFT current leakage during the touch scanning phase.

It should be noted that in the phase, because the touch scanning control terminal GCL of each stage of shift register unit is connected to the touch scanning control signal line GCLA, the touch scanning control terminal GCL of each stage of shift register unit inputs a high-level signal at the phase. As shown in FIG. 6 and FIG. 7B, the high level input from the touch scanning control terminal GCL of each stage of shift register unit can also turn on a seventh transistor (e.g. the seventh transistor T107 as shown in FIG. 6 and the seventh transistor T407 as shown in FIG. 7) of each stage of shift register unit, and thus the potential of the output terminal OUT of each stage of shift register unit can be further pulled down and denoised.

Meanwhile, in the touch scanning phase $f_{25}$, the touch scanning control signal triggers a touch scanning drive circuit to scan a touch panel or a touch circuit.

Next, as shown in FIG. 11, after the touch scanning phase $f_{25}$ is finished, the second phase $f_{22}$ is entered.

In the first sub-phase $f_{221}$ of the second phase $f_{22}$, the third clock signal line CLK3 provides a high-level signal. Because the clock signal terminal CLK of the (N+1)-th stage of shift register unit 202 is connected to the third clock signal line CLK3, a high-level signal is input to the clock signal terminal CLK of the (N+1)-th stage of shift register unit 202 at this phase. The high level input by the clock signal terminal CLK of the (N+1)-th stage of shift register unit 202 causes the potential of the first node PU_N+1 of the (N+1)-th stage of shift register unit 202 to be further pulled up to a second high level. Therefore, under control of the second high level of the first node PU_N+1 of the (N+1)-th stage of shift register unit 202, the high level input by the clock signal terminal CLK of the (N+1)-th stage of shift register unit 202 is output to the output terminal OUT_N+1 of the (N+1)-th of stage of shift register unit 202.

In the second sub-phase $f_{222}$ of the second phase $f_{22}$, the fourth clock signal line CLK4 provides a high-level signal. Because the clock signal terminal CLK of the (N+2)-th stage of shift register unit 202 is connected to the fourth clock signal line CLK4, a high-level signal is input to the clock signal terminal CLK of the (N+2)-th stage of shift register unit 202 in this phase. The high level input by the clock signal terminal CLK of the (N+2)-th stage of shift register unit 202 causes the potential of the first node PU_N+2 of the (N+2)-th stage of shift register unit 202 to be further pulled up to a second high level. Therefore, under control of the second high level of the first node PU_N+2 of the (N+2)-th stage of shift register unit 202, the high level input from the clock signal terminal CLK of the (N+2)-th stage of shift register unit 202 is output to the output terminal OUT_N+2 of the (N+2)-th stage of shift register unit 202.

The gate drive circuit 10 provided in the embodiments can charge the first node of the group of second shift register units through the voltage stabilization circuit in the touch scanning phase, so that the phenomenon of output abnormality such as horizontal lines at fixed positions caused by too low potential of the first node of the first few shift register units (i.e., the group of second shift register units) after the touch scanning phase is finished can be avoided, and further the display quality can be improved.

It should be noted that in a case where the gate drive circuit 10 provided in the embodiment of the present disclosure is used to drive a display panel, the gate drive circuit 10 may be on a side of the display panel. For example, the display panel includes a plurality of gate lines, and output terminals of respective shift register units of the gate drive circuit 10 may be configured to be connected to the plurality of gate lines in a one-to-one correspondence for outputting gate scanning signals to the plurality of gate lines. It should be noted that the gate drive circuit 10 may be on both sides of the display panel to realize double-sided driving, and the embodiment of the present disclosure does not limit the arrangement of the gate drive circuit 10.

Figure 12:
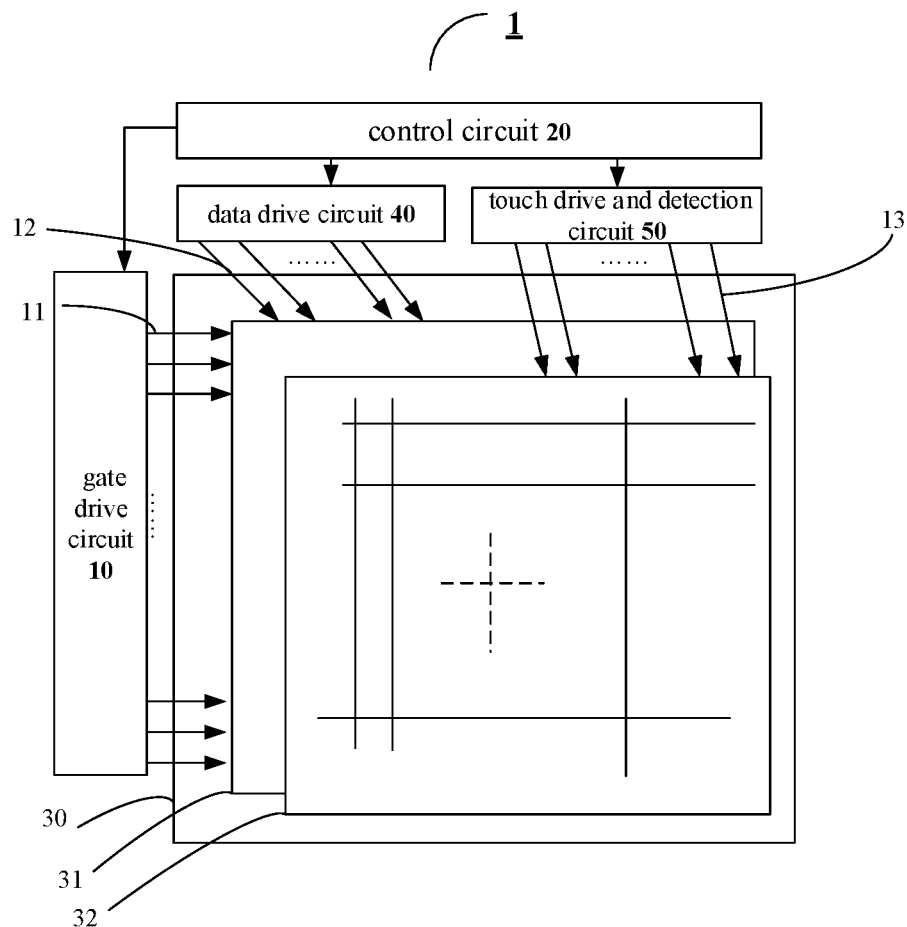
FIG. 12 is a schematic diagram of a touch display device provided by an embodiment of the disclosure.

Embodiments of the present disclosure also provide a touch display device 1. As shown in FIG. 12, the touch display device 1 includes the gate drive circuit 10 provided in the embodiments of the present disclosure. The touch display device 1 includes a control circuit 20, a gate drive circuit 10, a data drive circuit 40, a touch drive and detection circuit 50, and a touch display panel 30. For example, the data drive circuit 40 and the touch drive and detection circuit 50 may be integrated in an integrated circuit. For example, the data drive circuit 40 and the touch drive and detection circuit 50 operate in a time-sharing manner.

The control circuit 20 respectively supplies control signals to the gate drive circuit 10, the data drive circuit 40, and the touch drive and detection circuit 50 in response to externally supplied image signals, to control the gate drive circuit 10, the data drive circuit 40, and the touch drive and detection circuit 50 to operate with each other synchronously.

The touch display panel 30 includes a liquid crystal display panel 31 and a touch detection panel 32. For example, the touch display panel 30 is an in-cell touch display panel, that is, the touch detection panel 32 is located under the upper substrate of the liquid crystal display panel 31. It should be noted that the embodiment is not limited to this case; for example, the touch display panel may be other types of touch display panels such as an on-cell touch display panel.

For example, the liquid crystal display panel 31 includes an array of a plurality of pixels (not shown). The data drive circuit 40 is configured to provide a data signal to the pixel array; the gate drive circuit 10 is configured to provide a gate scanning signal to the pixel array. The data drive circuit 40 is electrically connected to the pixel array through data lines 12, and the gate drive circuit 10 is electrically connected to the pixel array through gate lines 11.

For example, the touch detection panel 32 is a self-capacitance type of touch sensor, which includes a touch drive electrode extended transversely and a touch detection electrode extended longitudinally as shown in the figure, and an array of detection capacitors is formed at positions where the touch drive electrode and the touch detection electrode are crossed with each other. The touch drive and detection circuit 50 is connected to the touch drive electrode and the touch detection electrode through touch drive lines 13.

In the touch detection operation, on the one hand, the touch drive and detection circuit 50 is used to provide a touch detection drive signal to the touch drive electrode to drive a touch detection scan. For example, in order to improve the touch reporting rate, a plurality of touch scanning phases are inserted in segments in the display phase of a frame. That is, in the scanning process of the gate drive circuit 10, the touch drive and detection circuit 50 provides the touch detection drive signal to the touch drive electrode for many times, thereby performing touch detection scanning on the touch detection panel 32 and transmitting a touch detection signal generated by the touch detection electrode in response to a touch operation, such as a finger or a stylus, to the touch drive and detection circuit 50.

On another hand, the touch drive and detection circuit 50 also detects whether a touch operation exists and determines a specific touch position based on a control signal supplied by the control circuit 20 and the touch detection signal generated from the touch detection electrode.

It should be noted that the touch display device 1 in this embodiments can be any product or component with a touch display function such as a liquid crystal panel, a liquid crystal television, a display, an OLED panel, an OLED television, an electronic paper display device, a mobile phone, a tablet computer, a notebook computer, a digital photo frame, a navigator, etc. The touch display device 1 may also include other conventional components such as a display panel, and the embodiments of the present disclosure are not limited thereto.

Technical effects of the touch display device 1 provided by the embodiments of the present disclosure may refer to the corresponding description of the gate drive circuit 10 in the above embodiment, and will not be described here again.

Figure 13:
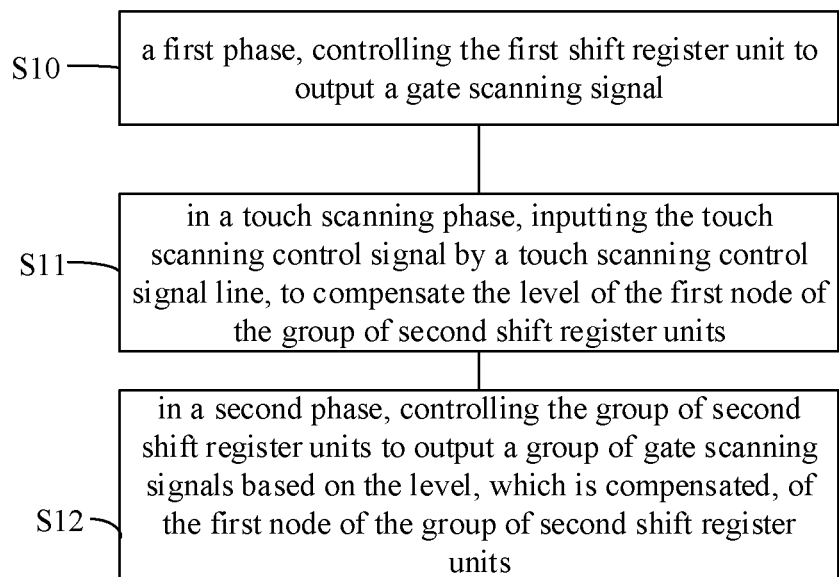
FIG. 13 is a schematic flow chart of a driving method of a gate drive circuit provided by an embodiment of the present disclosure.

An embodiment of the present disclosure also provides a driving method for driving the gate drive circuit described in any of the above embodiments. FIG. 13 is a schematic flow chart of a driving method of a gate drive circuit provided by an embodiment of the present disclosure. As shown in FIG. 13, the driving method may include the following steps:

S10: in a first phase, controlling the first shift register unit to output a gate scanning signal;

S11: in a touch scanning phase, inputting the touch scanning control signal by the touch scanning control signal line, to compensate the level of the first node of the group of second shift register units; and S12: in a second phase, controlling the group of second shift register units to output a group of gate scanning signals based on the compensated level of the first node of the group of second shift register units.

For example, the description of the first phase in step S10 may refer to the related description of the first phase $f_{11}$ in the above-mentioned embodiment as shown in FIG. 9 or the first phase $f_{21}$ in the above-mentioned embodiment as shown in FIG. 11. The description of the touch scanning phase in step S11 may refer to the description of the touch scanning phase $f_{13}$ in the above embodiment as shown in FIG. 9 or the touch scanning phase $f_{25}$ in the above embodiment as shown in FIG. 11. The description of the second phase in step S12 may refer to the description of the second phase $f_{12}$ in the above-mentioned embodiment as shown in FIG. 9 or the second phase $f_{22}$ in the above-mentioned embodiment as shown in FIG. 11.

It should be noted that in the present disclosure, the first phase represents a phase of controlling the first shift register unit to output gate scanning signals, the second phase represents a phase of controlling the group of second shift register units to output gate scanning signals, and in a case where the group of second shift register units includes a plurality of second shift register units, the second phase includes a plurality of sub-phases, and the plurality of sub-phases correspond to the plurality of second shift register units in a one-to-one correspondence. For example, in the example as shown in FIGS. 10 and 11, the group of second shift register units includes two shift register units (i.e., the (N+1)-th stage of shift register unit and the (N+2)-th stage of shift register unit), and then the second phase includes two sub-phases (i.e., the first sub-phase and the second sub-phase); in the first sub-phase, the (N+1)-th stage of shift register unit is controlled to output an (N+1)-th gate scanning signal, and in the second sub-phase, the (N+2)-th stage of shift register unit is controlled to output an (N+2)-th gate scanning signal.

An example of the embodiments of the present disclosure also provides a driving method which can be applied to, for example, the gate drive circuit 10 as shown in FIG. 8, and the gate drive circuit includes two clock signal lines. For example, the N-th (N is an integer greater than 1) stage of shift register unit of the gate drive circuit 10 is the first shift register unit 201 and the (N+1)-th stage of shift register unit is the second shift register unit 202. The driving method may sequentially include the following operations.

S20: in a first phase, controlling the output terminal OUT_N of the N-th stage of shift register unit 201 to output the N-th gate scanning signal.

S21: in a touch scanning phase, inputting the touch scanning control signal by the touch scanning control signal line GCLA, to compensate a level of the first node of the (N+1)-th stage of shift register unit.

S22: in a second phase, controlling the output terminal OUT_N+1 of the (N+1)-th stage of shift register unit 202 to output an (N+1)-th gate scanning signal based on the compensated level of the first node of the (N+1)-th stage of shift register unit 202.

For example, in step S21, in the touch scanning phase, the first node PU_N+1 of the (N+1)-th stage of shift register unit 202 may be charged to compensate the level of the first node PU_N+1 of the (N+1)-th stage of shift register unit. In the touch scanning phase, the first node PU_N of the N-th stage of shift register unit 201 can also be charged.

It should be noted that in the example, the description of the first phase in step S20 can refer to the above-mentioned description of the first phase $f_{11}$ in the embodiment as shown in FIG. 9. The description of the touch scanning phase in step S21 may refer to the above-mentioned description of the touch scanning phase $f_{13}$ in the embodiment as shown in FIG. 9. The description of the second phase in step S22 may refer to the above-mentioned description of the second phase $f_{12}$ in the embodiment as shown in FIG. 9.

For example, another example of the embodiments of the present disclosure provides a driving method which can be applied to, for example, the gate drive circuit 10 as shown in FIG. 10, which includes four clock signal lines. For example, the (N−1)-th (N is an integer greater than 2) stage of shift register unit in the gate drive circuit 10 is the first shift register unit 201, the (N+1)-th stage of shift register unit and the (N+2)-th stage of shift register unit are the second shift register unit 202. The driving method may sequentially include the following operations.

S30: in a first phase, controlling the output terminal OUT_N−1 of the (N−1)-th stage of shift register unit 201 to output an (N−1)-th gate scanning signal.

S31: in a third phase, controlling the output terminal OUT_N of an N-th stage of shift register unit to output an N-th gate scanning signal.

S32: in a touch scanning phase, inputting the touch scanning control signal by the touch scanning control signal line GCLA, to compensate a level of the first node of the (N+1)-th stage of shift register unit and a level of the first node of the (N+2)-th stage of shift register unit; and S33: in a second phase, controlling the output terminal OUT_N+1 of the (N+1)-th stage of shift register unit 202 to output an (N+1)-th gate scanning signal based on the compensated level of the first node of the (N+1)-th stage of shift register unit 202, and controlling the output terminal OUT_N+2 of the (N+2)-th stage of shift register unit 202 to output an (N+2)-th gate scanning signal based on the compensated level of the first node of the (N+2)-th stage of shift register unit 202.

For example, in step S32, in the touch scanning phase, the first node PU_N+1 of the (N+1)-th stage of shift register unit 202 and the first node PU_N+2 of the (N+2)-th stage of shift register unit 202 may be charged to compensate the level of the first node PU_N+1 of the (N+1)-th stage of shift register unit 202 and the level of the first node PU_N+2 of the (N+2)-th stage of shift register unit 202. In the touch scanning phase, the first node PU_N−1 of the shift register unit 201 of the (N−1)-th stage can also be charged.

For example, in step S33, the second phase includes two sub-phases, for example, a first sub-phase and a second sub-phase. In the first sub-phase, based on the compensated level of the first node PU_N+1 of the (N+1)-th stage of shift register unit 202, the output terminal OUT_N+1 of the (N+1)-th stage of shift register unit 202 is controlled to output the (N+1)-th gate scanning signal; and in the second sub-phase, based on the compensated level of the first node PU_N+2 of the (N+2)-th stage of shift register unit 202, the output terminal OUT_N+2 of the (N+2)-th stage of shift register unit 202 is controlled to output the (N+2)-th gate scanning signal.

For example, in the embodiment, the description of the first phase in step S30 can refer to the above-mentioned description of the first phase $f_{21}$ in the embodiment as shown in FIG. 11. The description of the third phase in step S31 may refer to the above-mentioned description of the third phase $f_{23}$ in the embodiment as shown in FIG. 11. The description of the touch scanning phase in step S32 may refer to the above-mentioned description of the touch scanning phase $f_{25}$ in the embodiment as shown in FIG. 11. The description of the second phase in step S33 may refer to the above-mentioned description of the second phase $f_{22}$ in the embodiment as shown in FIG. 11.

It should be noted that, for example, in a case where the gate drive circuit 10 includes two clock signal lines, the detailed description and technical effects of the driving method of the gate drive circuit 10 can refer to the corresponding description of the gate drive circuit 10 as shown in FIG. 8. For example, in a case where the gate drive circuit 10 includes four clock signal lines, the detailed description and the technical effects of the driving method of the gate drive circuit 10 can refer to the corresponding description of the gate drive circuit 10 as shown in FIG. 10, which will not be repeated here. Those skilled in the art can easily understand that in a case where the driving method provided in this example includes a plurality of clock signal lines, such as six clock signal lines or eight clock signal lines, the first shift register unit 201 and the second shift register unit 202 in the driving method are changed accordingly.

Technical effects of the driving method of the gate drive circuit 10 provided by the embodiment of the present disclosure can be referred to the corresponding description of the gate drive circuit 10 in the above embodiment, and will not be repeated here.

The above description merely are exemplary embodiments of the disclosure, and are not intended to limit the scope of the disclosure, and the scope of the disclosure is determined by the appended claims.

What is claimed is:

1. A gate drive circuit, comprising:
   a plurality of cascaded shift register units, wherein each of the plurality of cascaded shift register units comprises a touch scanning control terminal, and the touch scanning control terminal is configured to receive a touch scanning control signal; and
   a voltage stabilization circuit, connected to a first shift register unit and a group of second shift register units after the first shift register unit, of the plurality of cascaded shift register units, and configured to compensate a level of a first node of the group of second shift register units in response to the touch scanning control signal,
   wherein the group of second shift register units comprises at least one second shift register unit;
   each of the plurality of cascaded shift register units further comprises an input terminal which is configured to control the level of the first node of the group of second shift register units according to an input signal,
   the voltage stabilization circuit is electrically connected to a first node of the first shift register unit and is electrically connected to an input terminal of the group of second shift register units, and is configured to compensate the level of the first node of the group of second shift register units under control of the touch scanning control signal and a level of the first node of the first shift resister unit;
   the voltage stabilization circuit comprises an input sub-circuit, a voltage stabilization switch sub-circuit and an output sub-circuit;
   the input sub-circuit is configured to input the touch scanning control signal to the voltage stabilization switch sub-circuit in response to the touch scanning control signal;
   the voltage stabilization switch sub-circuit is configured to charge the first node of the first shift register unit; and
   the output sub-circuit is configured to output the touch scanning control signal to the input terminal of the group of second shift register units under control of the level of the first node of the first shift register unit.

2. The gate drive circuit according to claim 1,
   wherein the input sub-circuit comprises a first transistor, a gate electrode of the first transistor is connected to a first electrode of the first transistor and configured to receive the touch scanning control signal, and a second electrode of the first transistor is configured to be connected to the voltage stabilization switch sub-circuit.

3. The gate drive circuit according to claim 2,
   wherein the voltage stabilization switch sub-circuit comprises a second transistor, a first electrode of the second transistor is configured to be connected to the second electrode of the first transistor, and a gate electrode of the second transistor is connected to a second electrode of the second transistor and is configured to be connected to the first node of the first shift register unit to charge the first node of the first shift register unit.

4. The gate drive circuit according to claim 2,
wherein the output sub-circuit comprises a third transistor, a gate electrode of the third transistor is configured to be connected to the first node of the first shift register unit, a first electrode of the third transistor is configured to receive the touch scanning control signal, and a second electrode of the third transistor is configured to be connected to the input terminal of the group of second shift register units.

5. The gate drive circuit according to claim 1,
wherein the input sub-circuit comprises a first transistor, a gate electrode of the first transistor is configured to receive the touch scanning control signal, a first electrode of the first transistor is connected to the input terminal of the group of second shift register units, and a second electrode of the first transistor is configured to be connected to the voltage stabilization switch sub-circuit.

6. The gate drive circuit according to claim 1, wherein each of the plurality of cascaded shift register units further comprises an input terminal, and the voltage stabilization circuit is electrically connected to an input terminal of the group of second shift register units;
the voltage stabilization circuit is configured to output a charging control signal to the input terminal of the group of second shift register units in response to the touch scanning control signal to compensate the level of the first node of the group of second shift register units.

7. The gate drive circuit according to claim 1, wherein each of the plurality of cascaded shift register units further comprises an output terminal, an input circuit, a first node reset circuit, an output circuit and a touch noise reduction circuit;
an input circuit of an M-th stage of shift register unit in the plurality of cascaded shift register units is configured to charge a first node of the M-th stage of shift register unit in response to an input signal;
a first node reset circuit of the M-th stage of shift register unit is configured to reset the first node of the M-th stage of shift register unit in response to a reset signal;
an output circuit of the M-th stage of shift register unit is configured to output a clock signal to an output terminal of the M-th stage of shift register unit under control of a level of the first node of the M-th stage of shift register unit; and
a touch noise reduction circuit of the M-th stage of shift register unit is configured to reset the output terminal of the M-th stage of shift register unit in response to the touch scanning control signal,
wherein M is a positive integer and is less than or equal to an amount of the plurality of cascaded shift register units.

8. The gate drive circuit according to claim 7, wherein each of the plurality of cascaded shift register units further comprises a pull-down circuit, a pull-down control circuit, a first node noise reduction circuit, and an output noise reduction circuit;
a pull-down circuit of the M-th stage of shift register unit is configured to control a level of a second node of the M-th stage of shift register unit under control of the level of the first node of the M-th stage of shift register unit and a level of a pull-down control node of the M-th stage of shift register unit;
a pull-down control circuit of the M-th stage of shift register unit is configured to control the level of the pull-down control node of the M-th stage of shift register unit under control of the level of the first node of the M-th stage of shift register unit;
a first node noise reduction circuit of the M-th stage of shift register unit is configured to perform noise reduction on the first node of the M-th stage of shift register unit under control of the level of the second node of the M-th stage of shift register unit; and
an output noise reduction circuit of the M-th stage of shift register unit is configured to perform noise reduction on the output terminal of the M-th stage of shift register unit under control of the level of the second node of the M-th stage of shift register unit.

9. The gate drive circuit according to claim 1, further comprising a first clock signal line and a second clock signal line,
wherein each of the plurality of cascaded shift register units further comprises a clock signal terminal,
the first clock signal line is connected to a clock signal terminal of a (2N−1)-th stage of shift register unit of the plurality of cascaded shift register units, and the second clock signal line is connected to a clock signal terminal of a 2N-th stage of shift register unit of the plurality of cascaded shift register units; and
N is an integer greater than 0.

10. The gate drive circuit according to claim 9, wherein each of the plurality of cascaded shift register units further comprises an input terminal, an output terminal and a reset terminal, and the group of second shift register units comprises only one second shift register unit;
an N-th stage of shift register unit of the plurality of cascaded shift register units is the first shift register unit, and a first node of the N-th stage of shift register unit is connected to the voltage stabilization circuit;
an (N+1)-th stage of shift register unit of the plurality of cascaded shift register units is the second shift register unit, and an input terminal of the (N+1)-th stage of shift register unit is connected to the voltage stabilization circuit;
except for a last stage of shift register unit, a reset terminal of an $n_1$-th stage of shift register unit of the plurality of cascaded shift register units is connected to an output terminal of an $(n_1+1)$-th stage of shift register unit of the plurality of cascaded shift register units;
except for a first stage of shift register unit and the (N+1)-th stage of shift register unit, an input terminal of an $n_2$-th stage of shift register unit in the plurality of cascaded shift register units is connected to an output terminal of the $(n_2-1)$-th stage of shift register unit in the plurality of cascaded shift register units; and
an amount of the plurality of cascaded shift register units is Q, N, Q, $n_1$ and $n_2$ are integers, $1<Q$, $1\leq N<Q$, $0<n_1<Q$, $1<n_2\leq Q$, and $n_2\neq N+1$.

11. A driving method for driving the gate drive circuit according to claim 10, comprising:
in a first phase, controlling an output terminal of the N-th stage of shift register unit to output an N-th gate scanning signal;
in a touch scanning phase, inputting the touch scanning control signal by a touch scanning control signal line, to compensate a level of a first node of the (N+1)-th stage of shift register unit; and in a second phase, controlling an output terminal of the (N+1)-th stage of shift register unit to output an (N+1)-th gate scanning signal based on the level, which is compensated, of the first node of the (N+1)-th stage of shift register unit.

12. The gate drive circuit according to claim 1, further comprising a first clock signal line, a second clock signal line, a third clock signal line, and a fourth clock signal line,
wherein each of the plurality of cascaded shift register units further comprises a clock signal terminal,
the first clock signal line is connected to a clock signal terminal of a $(4n_3-3)$-th stage of shift register unit of the plurality of cascaded shift register units, the second clock signal line is connected to a clock signal terminal of a $(4n_3-2)$-th stage of shift register unit of the plurality of cascaded shift register units, the third clock signal line is connected to a clock signal terminal of a $(4n_3-1)$-th stage of shift register unit of the plurality of cascaded shift register units, and the fourth clock signal line is connected to a clock signal terminal of a $4n_3$-th stage of shift register unit of the plurality of cascaded shift register units; and
$n_3$ is an integer greater than 0.

13. The gate drive circuit according to claim 1, further comprising a touch scanning control signal line,
wherein the touch scanning control terminal of each of the plurality of cascaded shift register units and the voltage stabilization circuit are electrically connected to the touch scanning control signal line to receive the touch scanning control signal.

14. A touch display device, comprising the gate drive circuit according to claim 1.

15. A driving method for driving the gate drive circuit according to claim 1, comprising:
in a first phase, controlling the first shift register unit to output a gate scanning signal;
in a touch scanning phase, inputting the touch scanning control signal by a touch scanning control signal line, to compensate the level of the first node of the group of second shift register units; and
in a second phase, controlling the group of second shift register units to output a group of gate scanning signals based on the level, which is compensated, of the first node of the group of second shift register units.

16. The gate drive circuit according to claim 1, wherein the voltage stabilization circuit is configured to output the touch scanning control signal to the input terminal of the group of second shift register units to compensate the level of the first node of the group of second shift register units under control of the touch scanning control signal and the level of the first node of the first shift register unit.

17. A gate drive circuit, comprising:
a plurality of cascaded shift register units, wherein each of the plurality of cascaded shift register units comprises a touch scanning control terminal, and the touch scanning control terminal is configured to receive a touch scanning control signal; and
a voltage stabilization circuit, connected to a first shift register unit and a group of second shift register units after the first shift register unit, of the plurality of cascaded shift register units, and configured to compensate a level of a first node of the group of second shift register units in response to the touch scanning control signal,
wherein the group of second shift register units comprises at least one second shift register unit;
the gate drive circuit further comprises a first clock signal line, a second clock signal line, a third clock signal line, and a fourth clock signal line; each of the plurality of cascaded shift register units further comprises a clock signal terminal; the first clock signal line is connected to a clock signal terminal of a $(4n_3-3)$-th stage of shift register unit of the plurality of cascaded shift register units, the second clock signal line is connected to a clock signal terminal of a $(4n_3-2)$-th stage of shift register unit of the plurality of cascaded shift register units, the third clock signal line is connected to a clock signal terminal of a $(4n_3-1)$-th stage of shift register unit of the plurality of cascaded shift register units, and the fourth clock signal line is connected to a clock signal terminal of a $4n_3$-th stage of shift register unit of the plurality of cascaded shift register units; and $n_3$ is an integer greater than 0;
each of the plurality of cascaded shift register units further comprises an input terminal, an output terminal and a reset terminal, and the group of second shift register units comprises two second shift register units;
an (N−1)-th stage of shift register unit of the plurality of cascaded shift register units is the first shift register unit, and a first node of the (N−1)-th stage of shift register unit is connected to the voltage stabilization circuit;
both an (N+1)-th stage of shift register unit and an (N+2)-th stage of shift register unit of the plurality of cascaded shift register units are the second shift register units, and both an input terminal of the (N+1)-th stage of shift register unit and an input terminal of the (N+2)-th stage of shift register unit are connected to the voltage stabilization circuit;
except for last two stages of shift register units, a reset terminal of an $n_4$-th stage of shift register unit of the plurality of cascaded shift register units is connected to an output terminal of an $(n_4-2)$-th stage of shift register unit of the plurality of cascaded shift register units;
except for a first stage of shift register unit, a second stage of shift register unit, the (N+1)-th stage of shift register unit and the (N+2)-th stage of shift register unit, an input terminal of an $n_5$-th stage of shift register unit of the plurality of cascaded shift register units is connected to an output terminal of the $(n_5+2)$-th stage of shift register unit of the plurality of cascaded shift register units; and
an amount of the plurality of cascaded shift register units is Q, N, Q, $n_4$ and $n_5$ are integers, $3<Q$, $2\leq N<Q-1$, $0<n_4<Q-1$, $2<n_5\leq Q$, and $n_5\neq N+1$, $n_5\neq N+2$.

18. A driving method for driving the gate drive circuit according to claim 17, comprising:
in a first phase, controlling an output terminal of the (N−1)-th stage of shift register unit to output an (N−1)-th gate scanning signal;
in a third phase, controlling an output terminal of an N-th stage of shift register unit of the plurality of cascaded shift register units to output an N-th gate scanning signal;
in a touch scanning phase, inputting the touch scanning control signal by a touch scanning control signal line, to compensate a level of a first node of the (N+1)-th stage of shift register unit and a level of a first node of the (N+2)-th stage of shift register unit; and
in a second phase, controlling an output terminal of the (N+1)-th stage of shift register unit to output an (N+1)-th gate scanning signal based on the level, which is compensated, of the first node of the (N+1)-th stage of shift register unit, and controlling an output terminal of the (N+2)-th stage of shift register unit to output an (N+2)-th gate scanning signal based on the level, which is compensated, of the first node of the (N+2)-th stage of shift register unit.

* * * * *